United States Patent [19]

Fujimaki

[11] Patent Number: 4,947,118
[45] Date of Patent: Aug. 7, 1990

[54] DIGITAL SQUID SYSTEM ADAPTIVE FOR INTEGRATED CIRCUIT CONSTRUCTION AND HAVING HIGH ACCURACY

[75] Inventor: Norio Fujimaki, Atsugi, Japan
[73] Assignee: Fujitsu Limited, Kawasaki, Japan
[21] Appl. No.: 273,592
[22] Filed: Nov. 21, 1988
[51] Int. Cl.$^5$ .......................................... G01R 33/035
[52] U.S. Cl. ................................. 324/248; 307/306; 505/846
[58] Field of Search ................. 324/248, 117 R; 128/653; 307/306; 505/846

[56] References Cited

U.S. PATENT DOCUMENTS

| 4,389,612 | 6/1983 | Simmonds et al. | 324/248 |
| 4,663,590 | 5/1987 | Gershenson et al. | 324/248 |
| 4,672,359 | 6/1987 | Silver | 324/248 X |

FOREIGN PATENT DOCUMENTS

| 3616865 | 11/1987 | Fed. Rep. of Germany | 324/248 |
| 62-102176 | 5/1987 | Japan . | |
| 63-149914 | 6/1988 | Japan . | |

OTHER PUBLICATIONS

D. Drung, Digital Feedback Loops for d.c. Squids, pp. 623–627, Cryogenics 1986, vol. 26, Nov.
D. Drung, Experimental Gradiometer with a digital feedback loop Extended Abstract of 1987 International Superconductivity Electronics Conference (ISEC'87) Aug., 1987, Tokyo, pp. 21–24.
Harada et al., "Experimental Result of QFP (part 2)", Third Symposium of Rikagaku Research Institute, pp. 53–58, Mar. 19, 1986.

Primary Examiner—Gerard R. Strecker
Attorney, Agent, or Firm—Staas & Halsey

[57] ABSTRACT

A SQUID system, such as a SQUID magnetometer, including a SQUID and a bias circuit supply a pulsed bias current to cause an output of a pulsed output from an injection point in the SQUID. The SQUID has a predetermined threshold characteristic which is asymmetrical with respect to a coordinate defined by a current to be measured and flowing through a first junction line and the bias current. The bias current supplied from the bias circuit comprises pulses which are alternately positive polarity pulses and negative polarity pulses, and has a first frequency. The threshold characteristic and the bias current are defined to output an output signal comprising pulses, the number thereof being proportional to the current to be measured and a polarity thereof corresponding to a polarity of the current to be measured.

36 Claims, 21 Drawing Sheets

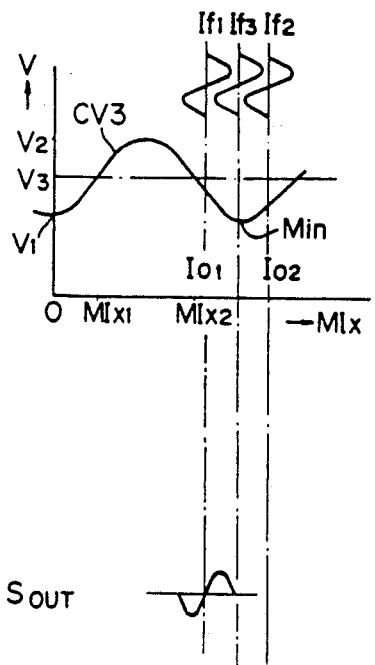
Fig. 3a
Fig. 3b  S_OUT
Fig. 3c  S_OUT
Fig. 3d  S_OUT (AT Min)

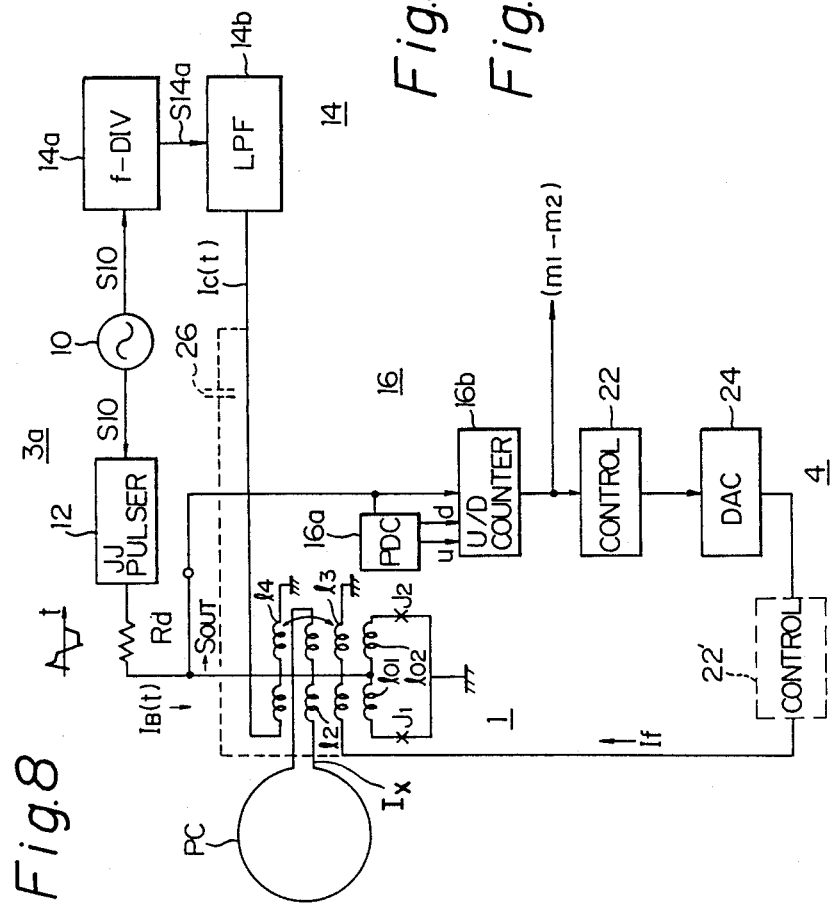

Fig.13
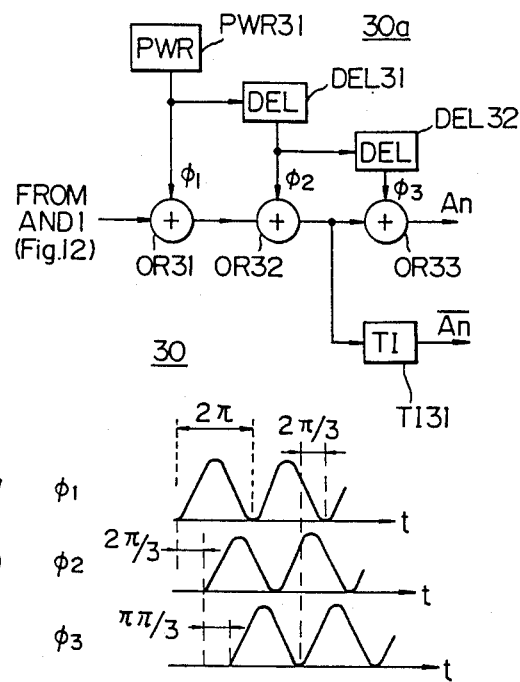
Fig.14a  $\phi_1$
Fig.14b  $\phi_2$
Fig.14c  $\phi_3$
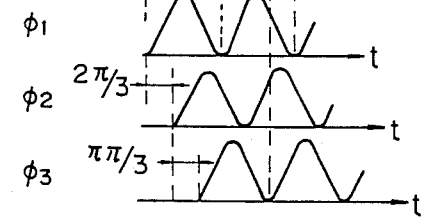
Fig.19
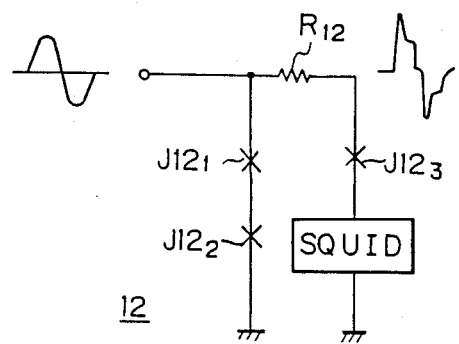

Fig. 17a   $S_{OUT}$   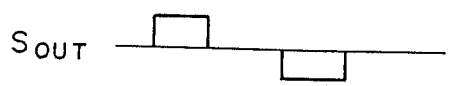
Fig. 17b   $I_1$   
Fig. 17c   $\bar{I}_1$   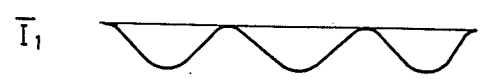
Fig. 17d   u   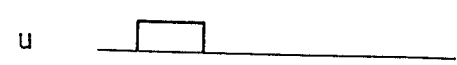
Fig. 17e   d   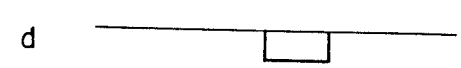
Fig. 18
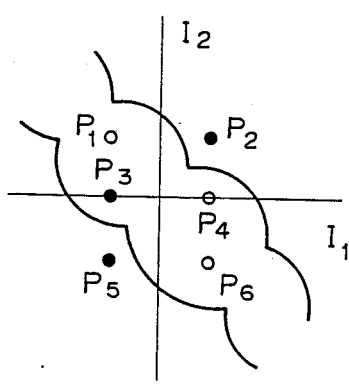

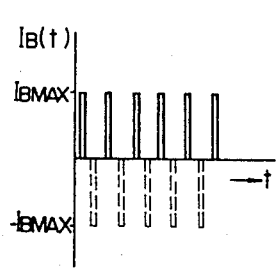
Fig. 29a
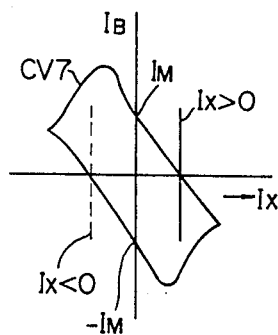
Fig. 29b
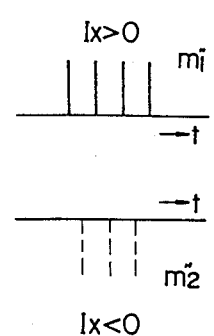
Fig. 29c
Fig. 29d
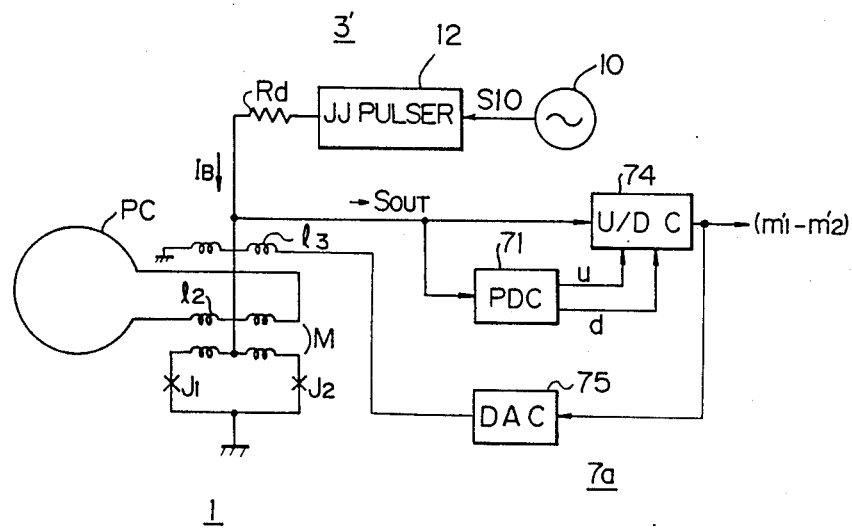
Fig. 30

DIGITAL SQUID SYSTEM ADAPTIVE FOR INTEGRATED CIRCUIT CONSTRUCTION AND HAVING HIGH ACCURACY

BACKGROUND OF THE INVENTION

1. Field of the Invention

The present invention relates to a superconducting quantum interference device (SQUID), more particularly, to a digital SQUID system in which a SQUID therein includes two Josephson junctions, a bias supplied to the SQUID is a pulse current, and a circuit for supplying the bias and a feedback circuit are formed in a single superconducting device chip together with the SQUID.

2. Description of the Related Art

SQUIDs are used for detecting a small current and other signals which can be converted into a current, such as a small magnetic flux, a small voltage or resistance, at a very high sensitivity. For example, SQUID magnetometers are used when measuring a small magnetic flux in a human body, e.g. in a brain or a heart, or a gravity wave, etc.

A SQUID, in general, is classified into two categories: an r.f. SQUID which includes a single Josephson junction, or a d.c. SQUID or two junction SQUID which includes two Josephson junctions. The SQUID system of the present invention pertains to the latter DC SQUID.

In addition, the two junction SQUID can be an analog type SQUID and a digital type SQUID, as described later in detail. The SQUID system of the present invention essentially relates to the digital type SQUID.

Each of the SQUID magnetometers includes a SQUID, a pick-up coil connected to the SQUID and a feedback circuit which supplies a control current to the pick-up coil or to the SQUID for compensating a magnetic flux detected by the pick-up coil.

Harada, et al., in "Experimental Result of QFP (part 2)", Third Symposium of Rikagaku Research Institute, pp. 53–58, Mar. 19, 1986 disclose a quantum flux parametron (QFP) magnetometer which can measure a magnetic flux at a high resolution. The QFP magnetometer, for example, as shown in FIG. 11 of this paper, includes a magnetic comparator consisting of a QFP circuit, having parametron elements which include two Josephson junctions and are connected through a superconducting line and a detector, a pick-up coil connected to the magnetic comparator, and a feedback circuit. The feedback circuit includes an averaging processor connected to the detector, an up/down (U/D) counter connected to the averaging processor, and a digital to analog converter (DAC) receiving a counted value from the U/D counter and supplying an analog converted value to the magnetic comparator. The QFP circuit has a structure shunted by a superconducting loop and does not provide a steady voltage. Accordingly, for example, by using another SQUID, a direction of a current flowing in the loop must be detected, and the circuit constructions of the magnetic comparator and the feedback circuit also differ from those of the present invention. Further, since the feedback circuit is operated at a room temperature, the QFP magnetometer is affected by thermal noise or cross talk and cannot be formed as a single superconductive IC chip.

JPA 62-102176 (Harada, et al., "Magnetometer and Preferred Superconducting Accumulation and Operation Circuit thereof") discloses a QFP magnetometer which is a modification of the QFP magnetometer described in the above paper. Namely, a superconducting feedback circuit for counting transient pulses output from the QFP is disclosed. It is assumed that a time of an output voltage is very short, typically 1 ps to 10 ps, when pulses, each having a long duration, for example, 1 ns are supplied, the QFP magnetometer cannot operate. Further, when pulses, each having a short duraton, are supplied, transient, phenomena must be taken into account, and a stable operation cannot be easily established. The QFP magnetometer, for example, as shown in FIG. 1 of JPA No. 62-102176, includes a pick-up coil 200, an inductor 2, a DC flux parametron (DCFP) circuit 500 having two Josephson junctions 100 and 101, an AC power supply 106 connected to the DCFP circuit 500, an accumulation and operation circuit 600 having two serial-connected SQUIDs 1a and 1b, a U/D counter 300, and DC power supplies 3a, 3b, and 400. The QFP magnetometer requires a relatively large number of power supplies 106, 3a, 3b and 400 and two SQUIDs in addition to the DCFP circuit, and accordingly, suffers from the disadvantage of a complex circuit construction. Further, the above power supplies and the U/D counter are provided under room temperature conditions. As a result, the QFP magnetometer can not be formed as a single superconductive IC chip.

JPA No. 63-149914 (Fujimaki, "Superconducting circuit") discloses a superconducting circuit consisting of a first Josephson junction device $J_1$, a second Josephson junction device $J_2$ and a Josephson circuit CCT, as shown in FIG. 1 of JPA No. 63-149914. In the superconducting circuit, by setting different gap voltages, which are voltages within a constant voltage region, of the Josephson devices $J_1$ and $J_2$, a rising output pulse current having a high amplitude and a subsequent output pulse current having a lower amplitude than that of the rising output pulse current are supplied to the Josephson circuit CCT to improve the measurement accuracy.

D. Drung, in "Digital feedback loops for DC SQUIDs", Cryogenics 1986 Vol. 26, November, pp. 623–727 discloses a SQUID magnetometer having a digital feedback loop. This paper deals with the feasibility of the integration of a digital feedback loop consisting of a binary U/D counter and a DAC on a chip formed by a Josephson technology, and discloses a technology for obtaining a digital output by supplying an output of the DC SQUID to an ADC integrated on a single chip. However, in the SQUID magnetometer of Drung, a bias which comprises a pulse train having only a positive polarity may be supplied to the SQUID, and thus any fluctuation of the amplitudes of the pulses may cause a fluctuation of an output pulse, producing noise. In other words, a strict stabilization of the amplitude of the bias pulse is required, and thus a complex and high cost bias supplying circuit must be provided.

SUMMARY OF THE INVENTION

An object of the present invention is to provide a digital SQUID system which can be easily formed by a superconductive IC chip.

Another object of the present invention is to provide a digital SQUID system which can operate at a high accuracy and with a high stability.

Still another object of the present invention is to provide a practical digital SQUID system having the above features.

According to the present invention, there is provided a SQUID system including: a first SQUID including first and second Josephson junctions, a first superconducting line connecting the first and second Josephson junctions and having an inductance component, and a first superconducting magnetically coupled line connected to a sensing element and magnetically coupled to the first superconducting line and a bias circuit, connected to the first superconducting line at a first injection point therein, for supplying a bias current to the first SQUID through the first injection point. The first SQUID has a predetermined threshold characteristic which is asymmetrical with respect to a coordinate defined by a current to be measured and flowing through the first magnetically coupled line and the bias current. The bias current supplied from the bias circuit comprises pulses which are alternatively positive polarity pulses and negative polarity pulses, and have a first frequency. The threshold characteristic and the bias current are defined to output an output signal, from the first injection point, comprising pulses having a frequency equal to the first frequency, the number of the output pulses being proportional to the current to be measured and a polarity of the output pulse corresponding to a polarity of the current to be measured or depending on the current to be measured.

The first SQUID further comprises a second superconducting magnetically coupled line magnetically coupled to the first superconducting line, and the SQUID system further comprises a feedback circuit having an input thereof connected to the first injection point and an output thereof connected to the second junction line, the feedback circuit receiving the output pulses and outputting a feedback signal to the second magnetically coupled line to cancel a magnetic flux on the basis of the current to be measured by another magnetic flux on the basis of the feedback current.

The feedback circuit comprises a superconducting pulse counting circuit counting up or down in response to positive or negative polarity pulses, and a superconducting digital to analog converter, operatively connected to the pulse counting circuit, for receiving a counted digital value from the pulse counting circuit and converting that counted value into an analog signal to be supplied to the second junction line.

The feedback circuit further comprises a superconducting controller for proportional, integral and/or differential control of a circuit including the feedback circuit.

The first SQUID further comprises a third superconducting magnetically coupled line magnetically coupled to the first superconducting line, and the SQUID system further comprises a superconducting control circuit for outputting a triangle-wave control signal to the third junction line, the triangle-wave control signal having a second frequency lower than the first frequency of the bias current, and the triangle-wave control signal is magnetically superimposed on the current to be measured.

The bias circuit supplies an amplitude modulation pulsed bias current, the maximum amplitude of the bias pulsed bias current being higher than a total critical current of the first SQUID, and the minimum amplitude of the bias current being lower than the total critical current, and the maximum and minimum amplitudes and the threshold characteristic of the first SQUID being defined to output the output signal comprising at least one pulse, from an injection point in the first superconducting line, the number of output pulses being proportional to the current to be measured.

The amplitude modulation pulsed bias current is modulated by a sinusoidal-wave signal.

The SQUID system further includes: a second SQUID including third and fourth Josephson junctions, a second superconducting line connecting the third and fourth Josephson junctions and having a second inductance component, and a fourth superconducting magnetically coupled line magnetically coupled to the second superconducting line; and an additional superconducting line portion comprising an additional superconducting line, having an inductance component, operatively connected to the second injection point at a terminal thereof and a common connected point of the third and fourth Josephson junctions, and magnetically coupled to the first superconducting line in the first SQUID. A second injection point in the second superconducting line and a terminal of the fourth superconducting magnetically coupled line are operatively connected to the first injection line to generate a positive or a negative flux quantum in response to a positive or a negative polarity of an output pulse from the first injection point. The additional superconducting line stores a magnetic flux in response to the positive flux quantum from the second SQUID and outputs a flux quantum therein in response to the negative flux quantum, adding the magnetic flux therein to the first superconducting line in the first SQUID and supplying a current proportional to the stored magnetic flux to the second injection point.

The second SQUID includes a first superconducting resistor connected between the input terminal of the fourth superconducting magnetically coupled line and the first injection point, and a second superconducting resistor connected between the first and second injection points, the resistance of the first and second superconducting resistors being defined to generate a flux quantum in the second SQUID in response to an output pulse from the first injection point.

The SQUID system further include a superconducting damping resistor connected in parallel to the additional superconducting line.

Another terminal of the fourth superconducting magnetically coupled line may be connected to the second injection point.

According to the present invention, there is also provided a SQUID system including: a first SQUID including first and second Josephson junctions, a first superconducting line connecting the first and second Josephson junctions and having an inductance component and a first superconductance magnetically coupled line connected to a sensing element and magnetically coupled to the first superconducting line; and a bias circuit, connected to the first superconducting line at a first injection point therein, for supplying a bias current to the first SQUID through the first injection point. The first SQUID has a predetermined threshold characteristic which is asymmetrical with respect to a coordinate defined by a current to be measured and flowing through the first junction line and the bias current, and the bias circuit supplies a pulsed bias current having the first frequency, and at least one polarity, an amplitude of the pulsed bias current being approximately equal to or slightly lower than a total critical current of the first SQUID, so that an output signal comprising one or more pulses, the number thereof being proportional to the current to be measured, is output from the first injection point.

BRIEF DESCRIPTION OF THE DRAWINGS

Other objects and features of the present invention will be described in more detail with reference to the accompanying drawings, in which:

FIGS. 3a to 3d are graphs explaining the operation of the SQUID system shown in FIG. 1;

FIG. 8 is a circuit diagram of the digital SQUID system shown in FIG. 5;

FIGS. 9a and 9b are wave forms of a control signal generation circuit shown in FIG. 8;

FIG. 10 is a pulse wave graph of an output signal obtained by the digital SQUID system shown in FIG. 8;

FIG. 13 is a circuit diagram of a latch circuit shown in FIG. 12 formed by a superconducting technology;

FIGS. 14a to 14c are graphs of wave forms of power signals supplied to the latch circuit shown in FIG. 13;

FIGS. 17a to 17e are graphs explaining the operation of the polarity detection circuit shown in FIG. 15;

FIG. 18 is a graph explaining the operation of the polarity detection circuit shown in FIG. 15;

FIG. 19 is a circuit diagram of a Josephson junction pulser shown in FIG. 8;

FIGS. 29a to 29d are graphs explaining the operation of the digital SQUID system shown in FIG. 28;

FIG. 30 is another circuit diagram of the digital DC type SQUID system shown in FIG. 27;

DESCRIPTION OF THE PREFERRED EMBODIMENTS

Before describing the preferred embodiments of the present invention, an example of a prior art DC SQUID system is described with reference to the drawings.

Figure 1:
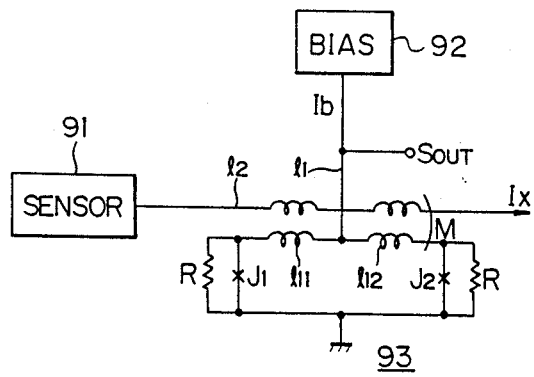
FIG. 1 is a block diagram of a prior art DC SQUID system.

FIG. 1 shows a block diagram (or an equivalent circuit) of a prior art DC SQUID magnetometer. In the Figure, a DC SQUID 93 includes a superconducting loop consisting of two Josephson junctions $J_1$ and $J_2$, indicated by cross marks (X) and coils, resistors R connected in parallel to the Josephson junctions $J_1$ and $J_2$, and a magnetically coupled line (or a magnetically coupled control line) $l_2$ magnetically coupled to the superconducting loops by a mutual inductance M. In a superconducting circuit, inductance components are main components, and thus only coils $l_{11}$ and $l_{12}$ in the superconducting loop are represented as shown in FIG. 1. The DC SQUID magnetometer includes a bias current supply circuit 92 supplying a bias current $I_b$ to the superconducting loop through a line $l_1$, and a sensing element 91, for example, a pick-up coil, in addition to the DC SQUID. The magnetically coupled line $l_2$ is also a signal line which carries a signal current $I_X$ supplied by the pick-up coil interlinking magnetic flux to be measured.

Figure 2A:
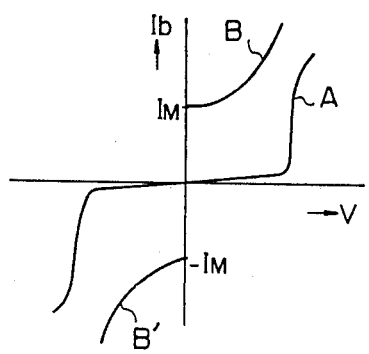
FIGS. 2a and 2b are graphs of current and voltage characteristics explaining the operation of the SQUID system shown in FIG. 1.
Figure 2B:
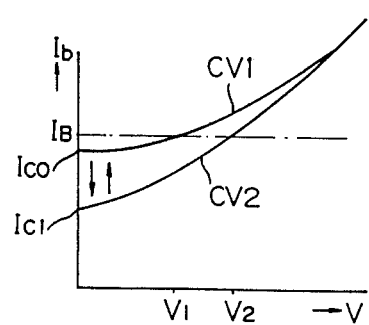

In general, two types of Josephson junctions are used: a bridge junction, a current and voltage (I-V) characteristic thereof having no hysteresis, and a tunnel type junction having a hysteresis I-V) characteristic as shown by curves A, B and B' in FIG. 2a and a resistor, connected in parallel to the tunnel type junction, for eliminating the hysteresis as shown in FIG. 2b. The Josephson junctions $J_1$ and $J_2$ and the resistors R shown in FIG. 1 show the I-V characteristic as shown in FIG. 2b. In FIG. 2b, a curve $CV_1$ represents a characteristic under the following condition:

$$MI_X = m\phi_0 \tag{1}$$

where,

M denotes a mutual inductance, $I_X$ denotes a signal current to be measured, m denotes a mode which is represented by a positive integer, m=0, 1, ..., n, and $\phi_0$ denotes a flux quantum, $\phi_0 = 2.07 \times 10^{-15}$ (Wb).

A curve $CV_2$ represents another characteristic under the following condition:

$$MI_X = (m + \tfrac{1}{2})\phi_0 \tag{2}$$

When a bias current $I_b$ is supplied, the same half currents $I_b/2$ flow through two branched superconducting loops; one consisting of the coil $l_{11}$ and the Josephson junction $J_1$, and the other consisting of the coil $l_{12}$ and the Josephson junction $J_2$, when $l_{11}=l_{12}$. When the current $I_b/2$ is lower than a critical current $I_M$ for a single Josephson junction shown in FIG. 2a, the Josephson junction $J_1$ and $J_2$ are in a superconductive state and the junction terminal voltages of the Josephson junctions $J_1$ and $J_2$ are zero volt as shown in FIG. 2a. Accordingly, a voltage of an output signal $S_{OUT}$ is zero volt. A circular current due to the magnetic field flows so as to satisfy a quantum condition in the superconducting loop. This circular current flows in a same direction as that of the bias current at one of the Josephson junctions $J_1$ and $J_2$, and in another direction which is the reverse of that of the bias current at the other of the Josephson junctions $J_1$ and $J_2$. When the bias current is increased, the circular current exceeds the critical current $I_M$ of the Josephson junction where the circular current flows in the same direction as that of the bias current. This Josephson junction is shifted to a condition where a voltage is output, and the other Josephson junction is also shifted to the voltage output condition. The amplitude of the circular current depends upon the magnetic flux, non-linearly. When the signal current $I_X$ is increased, a total critical current $I_{MM}$ of both Josephson junctions $J_1$ and $J_2$ is lowered and reaches $I_{c1}$ when $M_I = \phi_0/2$. When the signal current $I_X$ is further increased, in turn, the total critical current $I_{MM}$ is raised and reaches $I_{CO}$ ($I_{MM}=I_{CO}$) when $MI_x=\phi_0$. The above mentioned phenomena can be periodically repeated by changing the current $I_X$. In sum, the following relationships stand:

$$I_{MM}=I_{CO} \text{ when } MI_x=m\phi_0$$

$$I_{MM}=I_{C1} \text{ when } MI_x=(m+\tfrac{1}{2})\phi_0 \qquad (3)$$

The above m indicates a mode, for example, when $m=0$, the "0" mode exists, and when $m=1$, the "1" mode exists, and so on, and represents a state where m flux quantum $\phi_0$ is (are) introduced into the superconducting loop.

When the bias current flowing through the Josephson junctions $J_1$ and $J_2$ exceed the critical current $I_M$, the voltages between the terminals of the Josephsons junctions $J_1$ and $J_2$ are generated, and these voltages are output as the output signal $S_{OUT}$. The voltage V of the output signal is increased along the curves $CV_1$ and $CV_2$, and other curves (not shown) between the curves $CV_1$ and $CV_2$, in response to the signal current $I_X$. The curve $CV_3$ in FIG. 3a shows the relationship between the magnetic flux $MI_X$ and the voltage V. The curve $CV_3$ shows a periodical change of the voltage V.

In FIG. 3a when $MI_X=0$ the bias current may be a current $I_B$ as shown in FIG. 2b which is higher than the critical currents $I_{CO}$, and accordingly, the voltage V is a voltage $V_1$ which is not zero. In this condition, when the signal current $I_X$ is increased, the curve $CV_1$ is lowered and the voltage V is increased. When the characteristic curve in FIG. 2b reaches the curve $CV_2$, the voltage V reaches the maximum voltage $V_2$ shown in FIG. 3a. When the signal current $I_X$ is further increased, the curve $CV_2$ is shifted to the curve $CV_1$ and the voltage V is lowered from the maximum voltage $V_2$ to the minimum voltage $V_1$. The above phenomena are repeated as by the curve $CV_3$ shown in FIG. 3a.

The signal current $I_X$ corresponds to a change of the magnetic flux interlinking the pick-up coil and can be determined by measuring the voltage V of the output signal $S_{OUT}$, and thus, in principal, the magnetic flux interlinking the pick-up coil can be obtained by measuring the voltage V. The voltage V, however, is changed along the periodical curve $CV_3$, and accordingly, the relationship between the voltage V and the signal current $I_X$ is nonlinear. Further, when the voltage V having a voltage $V_3$ is obtained, and a unique magnetic flux $MI_X$ is not determined, a plurality of conditions may exist: i.e., $MI_X=MI_{X1}$, $MI_X=MI_{X2}$, ..., $MI_X=MI_{Xn}$. Therefore, in an actual DC SQUID system, a feedback circuit, as shown in FIG. 4, is provided to determine a unique $MI_X$.

Figure 4:
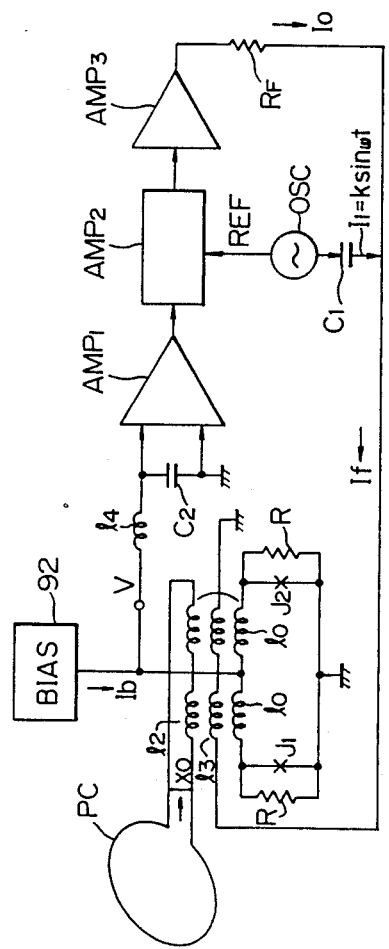
FIG. 4 is a circuit diagram of the SQUID system shown in FIG. 1.

In FIG. 4, the feedback circuit includes a filter consisting of a coil $l_4$ and a capacitor $C_2$, a DC amplifier $AMP_1$, a lock-in amplifier $AMP_2$, an amplifier $AMP_3$, an oscillator OSC, a feedback resistor $R_F$, and a capacitor $C_1$. The feedback circuit sends a feedback current $I_f$ through a superconductive magnetically coupled line $l_3$ which is additionally provided in the DC SQUID to constantly maintain an operation point of the (V-$MI_X$) characteristic at the minimum point: i.e., to constantly maintain the voltage V at the minimum voltage $V_1$ shown in FIG. 3. The feedback circuit has an advantage of being free from the effects of drifts which may occur in the bias current supply circuit 2 and the DC amplifier $AMP_1$. Reference PC represents a pick-up coil. The feedback circuit shown in FIG. 4 is "an analog type feedback circuit", and is operated at a room (ambient) temperature. The bias current supply circuit 92 is also provided under room temperature conditions. The pick-up coil PC is placed at a point to be measured and is under room temperature conditions. The DC SQUID is placed under superconductive conditions, such as a liquid Helium bath.

The oscillator OSC outputs an oscillated reference signal REF: REF=$k \sin\omega t$ having an oscillation frequency f, for example, 10 kHz, to the lock-in amplifier $AMP_2$ and the capacitor $C_1$. The low noise amplifier $AMP_1$ amplifies the output voltage V. The lock-in amplifier $AMP_2$ receives and compares the amplified output voltage V and the reference signal REF, and outputs a DC signal corresponding to the amplitude, and phase within the same frequency components as those of the above output voltage V and the reference signal REF. The DC signal output from the lock-in amplifier $AMP_2$ is expressed by the product of the output voltage V and the reference signal REF, and is a positive voltage ($+v_1$) when both signals are in-phase, a negative voltage ($-v_2$) when the phases of both signals are reversed, and zero ("0") volt when the phases are shifted by 90°. The amplifier $AMP_3$ amplifies the DC signal output from the lock-in amplifier $AMP_2$ and outputs same to the feedback resistor $R_F$. The capacitor $C_1$ passes only an AC component $k \sin\omega t$ of the reference signal REF from the oscillator OSC. Accordingly, the feedback signal $I_f$ is expressed by the following formula:

$$I_f = I_0 + k \sin\omega t \qquad (4)$$

where, $I_0$ denotes a current passing through the feedback resistor $R_F$.

A signal current $I_X$ passing through the magnetic field junction line $l_2$ is represented by the following formula when a mutual inductance $M_1$ between the lines $l_2$ and $l_0$ is equal to a mutual inductance $M_2$ between the lines $l_3$ and $l_0$:

$$I_X = I_{X0} + I_f \quad (5)$$

where, $I_{X0}$ denotes an original signal current detected by the pick-up coil PC.

The bias current $I_b$ supplied by the bias current supply circuit 92 is set at a current $I_B$ shown in FIG. 2b. Since the signal current $I_X$ includes a (sin$\omega$t) component, the output voltage V contains the (sin$\omega$t) component. The lock-in amplifier AMP$_2$ outputs the voltage signal having a positive polarity when the output voltage V and the reference signal REF are in-phase. When the current $I_0$ output from the amplifier AMP$_3$ is $I_{01}$, i.e., the output voltage V on a negative slope on the curve CV$_3$ shown in FIG. 3a the feedback current $I_f$ becomes $I_{f1}$ as shown in FIG. 3a. Since the slope at this operation point is negative, the output voltage V and the feedback current $I_{f1}$ are in an out of phase condition. The output voltage is inversed at the amplifier AMP$_1$, a signal supplied to the lock-in amplifier AMP$_2$ and the reference REF are in an in-phase condition, outputting a positive polarity voltage. As a result, the current $I_0$ is increased and the operation point is shifted to the minimum point shown in FIG. 3a. When the current $I_0$ output from the amplifier AMP$_3$ is $I_{02}$, i.e., the output voltage V is on a positive slope on the curve CV$_3$, the feedback current If becomes $I_{f2}$, and an operation which is the reverse of the above operation can be carried out to shift the operation point to the minimum point.

Subsequently, the signal current $I_x$ is maintained at the current $I_{00}$ of the minimum point, and this operation is called a null operation.

When the original current $I_{X0}$ is zero the current $I_0 = I_{00}$ is obtained where the output voltage V is maintained at the minimum voltage $V_1$ by adjusting the feedback circuit. When the original current $I_{X0}$ flows during the measurement and the current $I_0$ is obtained, the signal current $I_X = I_{00} - I_0$ is obtained. This signal current $I_X$ indicates the magnetic flux to be measured, and is obtained by measuring the current $I_0$.

The feedback circuit shown in FIG. 4 is formed as an analog feedback circuit having the low noise amplifiers AMP$_1$ to AMP$_3$, and is provided under room temperature conditions, and thus has a large thermal noise, compared with the SQUID, and causes a reduction of the total sensitivity. In addition, the feedback circuity is formed separately from the SQUID, and accordingly, a single chip type DC SQUID system in which the DC SQUID and the feedback circuit are integrated in a single chip can not be realized. For example, in a medical system, in order to speed up the measurement and simultaneously measure a plurality of points, many SQUID magnetometers can be used. In this regard, the integration of the SQUIDs and the feedback circuits is most important.

An example of a GaAs FET operating at a liquid Helium temperature and used for a first-stage amplifier is known, but the GaAs FET and the SQUID are not formed by the same process, and thus substantially a single chip SQUID magnetometer can not be formed. Further, in the combination of the known superconducting devices, desired amplifiers AMP$_1$ to AMP$_3$ cannot be formed.

Now, preferred embodiments of the present invention will be described.

Figure 5:
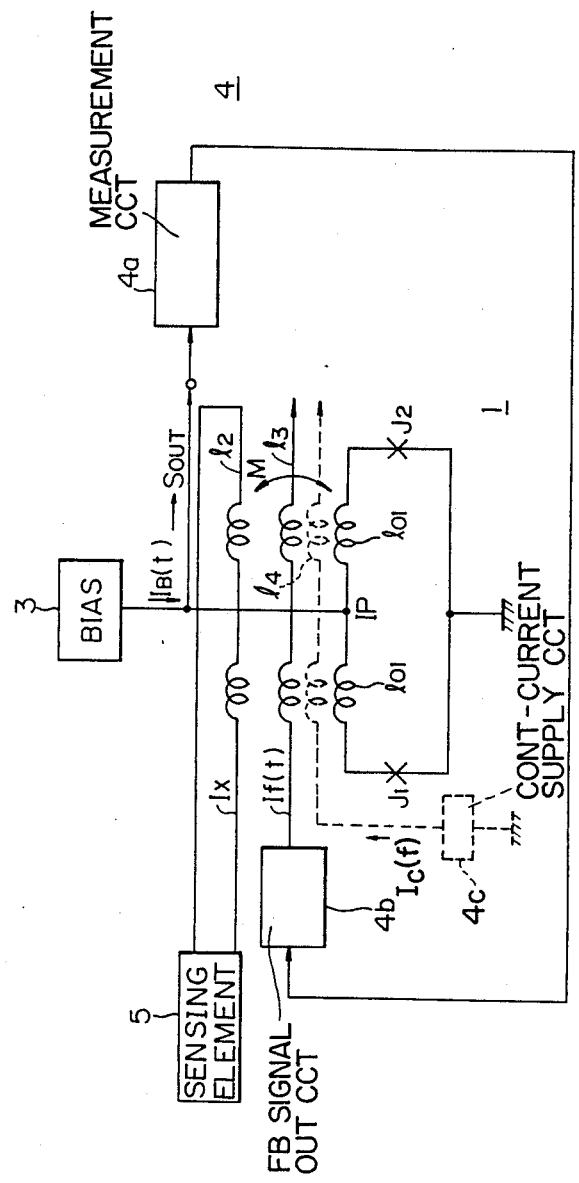
FIG. 5 is a block diagram of a digital SQUID system of a first embodiment in accordance with the present invention.

Referring to FIG. 5, a first embodiment of a digital SQUID system in accordance with the present invention will be described. The digital SQUID system includes a SQUID 1 consisting of Josephson junctions J$_1$ and J$_2$, coils $l_{01}$ and $l_{01}$, and magnetically coupled lines $l_2$ and $l_4$, a sensing element 5, a bias supply circuit 3, a feedback circuit 4 consisting of a measurement circuit 4a and a feedback signal output circuit 4b, and a control current supply circuit 4c (shown by a dotted line). Note that the resistors R shown in FIGS. 1 and 4 are not provided.

Figure 6:
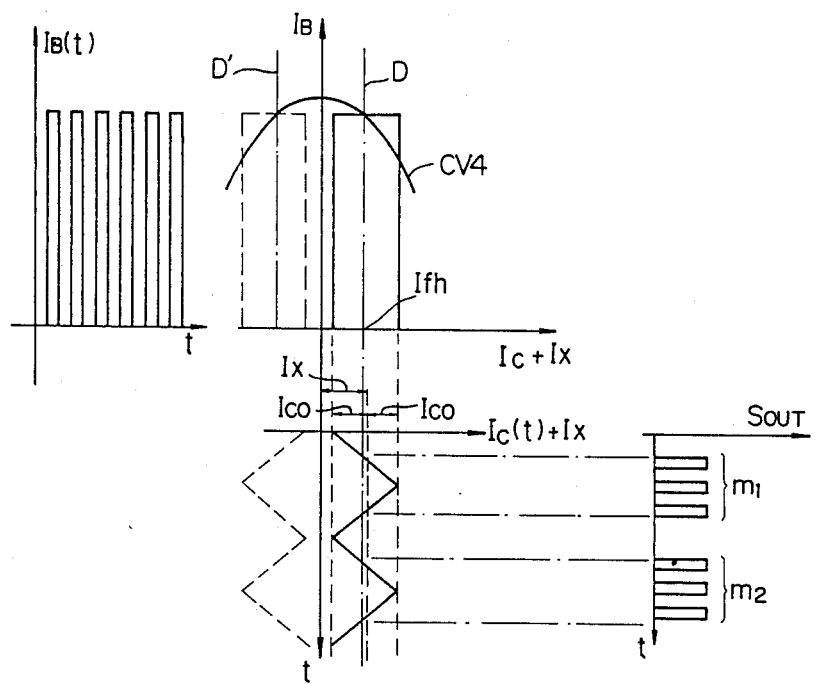
FIGS. 6 and 7 are graphs explaining the operation of the digital SQUID system shown in FIG. 5.

The bias supply circuit 3 supplies a pulsed bias current $I_B(t)$, having a frequency $f_B$, as shown in FIG. 6, to the SQUID 1, and differs from the prior art bias supply circuit which provides the DC bias current. The sensing element 5 sends a current to be measured (a measuring current) $I_X$ through the magnetically coupled line $l_2$ in response to a measuring condition or status, for example, a magnetic flux. Since the resistors R are not provided in parallel to the Josephson junctions J$_1$ and J$_2$, a basic operation of the SQUID 1 is subjected to the characteristic curves B and B' shown in FIG. 2a, and thus an output signal $S_{OUT}$ can be a pulsed voltage. The measurement circuit 4a includes a counter and counts the pulsed voltage. The control current supply circuit 4c supplies a control current $I_C(t)$ having a triangle-wave form (a saw-teeth wave form) and a frequency $f_C$, as shown in FIG. 6, to the magnetically coupled line $l_4$. The feedback signal output circuit 4b supplies a feedback current $I_f(t)$ proportional to the counted value at the counter in the circuit 4a to the magnetically coupled line $l_3$. The frequency $f_B$ of the bias current $I_B(t)$ is higher than the frequency $f_C$ of the feedback current $I_f(t)$.

Referring to FIG. 6, the operation of the digital SQUID system in which the feedback circuits 4a and 4b are not provided will be described. The curve CV4 shows a threshold characteristic of the bias current $I_B(t)$. If an amplitude of the bias current $I_B(t)$ is such that the amplitude exceeds the threshold of the curve CV4, when the current $(I_C(t) + I_X)$ exceeds a threshold current $I_{th}$, at the right side of a straight line D, and when the current $(I_C(t) + I_X)$ exceeds the threshold current $I_{th}$ and the bias current $I_B(t)$ is supplied to the SQUID 1, the output signal $S_{OUT}$, which has $m_1$ pulses and $m_2$ pulses is output. In other circumstances, the output signal $S_{OUT}$ is not output.

A duration (time) T for which the pulsed output signal $S_{OUT}$ is output is expressed by the following formula:

$$\frac{1}{f_C \cdot T} = \frac{2 \cdot I_{C0}}{I_X + I_{C0} - I_{th}} \quad (6)$$

$$\therefore T = \frac{1}{f_C} \cdot \frac{I_X + I_{C0} - I_{th}}{2 \cdot I_{C0}}$$

where, $I_{C0}$ represents an amplitude of the control current $I_C$.

Further, the number p of pulses output during the duration T is expressed by the following formula:

$$p = f_B \cdot T \quad (7)$$
$$= \frac{f_B}{f_C} \cdot \frac{I_X + I_{C0} - I_{th}}{2 \cdot I_{C0}}$$

The parameters $f_B$, $f_C$, $I_{C0}$ and $I_{th}$ are previously determined, and thus the measuring current $I_X$ is obtained by measuring (counting) the number m of the pulses, as follows:

$$I_X = 2 \cdot I_{CO} \cdot p - I_{CO} + I_{th} = k_1 \cdot p + k_2 \quad (8)$$

where, $k_1 = 2 \cdot I_{CO}$, and $k_2 = -I_{CO} + I_{th}$

The number p of the output pulse can be counted by a counter. Digital electronic circuits, such as the counter, can be easily formed by a superconducting circuit including Josephson junctions therein. Accordingly, a SQUID and a digital feedback circuit can be formed in a single superconducting IC chip.

Figure 7:
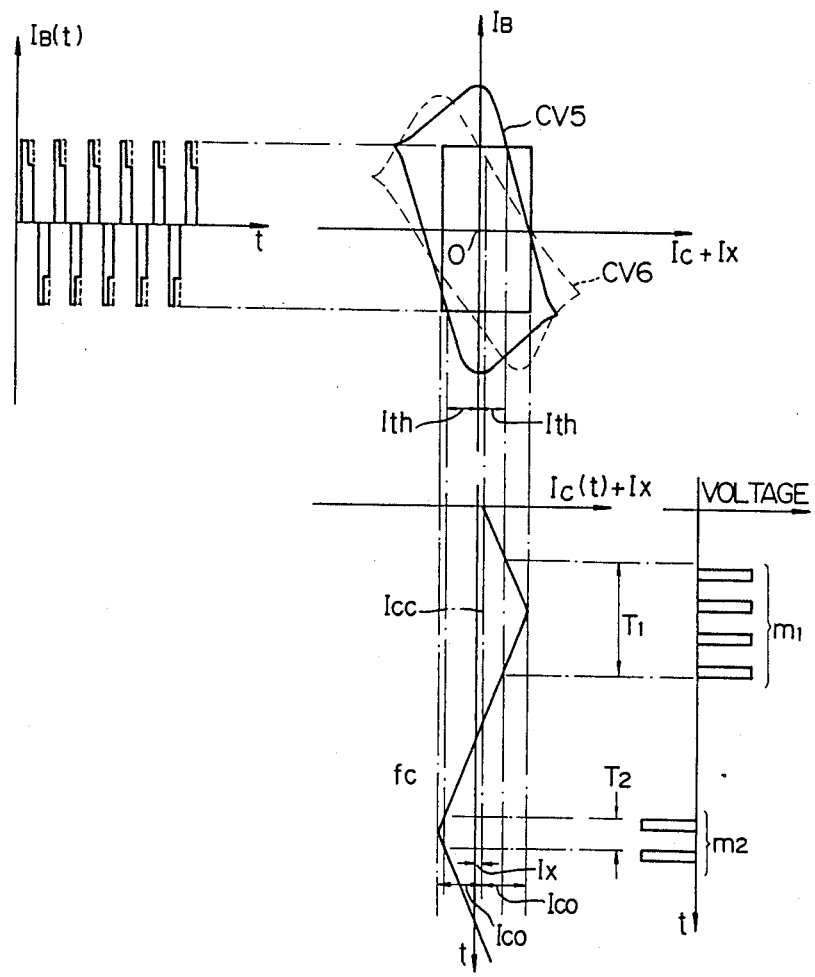

FIG. 7 shows other threshold characteristic curves CV5 and CV6, another wave form of the bias current $I_B(t)$, and the operation therefor. The threshold characteristic curve CV4, which is partially shown in FIG. 6, has a symmetrical shape with respect to a vertical axis showing the bias current $I_B$, but the threshold characteristic curves CV5 and CV6 have asymmetrical shapes with respect to the vertical axis showing the bias current $I_B$. Further, the bias current $I_B(t)$ shown in FIG. 6 comprises positive pulses, but the bias current $I_B(t)$ shown in FIG. 7 comprises alternate pulses each of which has a step form wave and consists of a starting portion having a high amplitude and an ending portion having a low amplitude.

The asymmetrical threshold characteristic is used to easily obtain the output signal $S_{OUT}$ composed of positive polarity pulses $\underline{m_1}$ when the positive bias current $I_B(t)$ is applied and the output signal $S_{OUT}$ composed of negative polarity pulses $\underline{m_2}$. Conversely, under the symmetric threshold characteristic shown in FIG. 6, as shown by dotted lines in FIG. 6, since pulses can be output at the left side of a vertical line D', the signal processing is complex. In addition, the step-shaped bias pulse current $I_B(t)$ is used to shorten a time for which the bias pulse is in a peak state, and thus avoid (or minimize) a malfunction due to thermal noise, etc., which may occur when the operation point approaches the threshold value.

Figure 31:
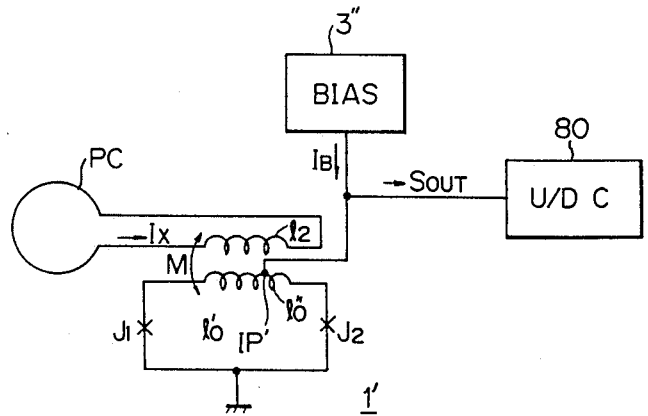
FIG. 31 is a block diagram of a digital SQUID system of a third embodiment in accordance with the present invention.

The asymmetry of the threshold characteristic can be obtained by selecting a ratio of the total critical currents $I_{MM}$ of the Josephson junctions $J_1$ and $J_2$. For example, the characteristic curve CV5 shown in FIG. 7 is that when the critical current ratio is 1:3. In general, a variety of threshold characteristics can be obtained by changing the critical current ratio, and the inductance values of the superconducting loop inductance components $l_{01}$ and $l_{02}$: an injection point IP shown in FIG. 5 injecting the bias current. Note the injection point IP shown in FIG. 5 is a center of the superconducting loop: $l_{01} = l_{02}$, but an injection point IP' shown in FIG. 31 is not a center of the superconducting loop.

Referring back to FIG. 7, the output signal $S_{OUT}$ having the $\underline{m_1}$ pulses or the $\underline{m_2}$ pulses can be output when the sum current $\{I_f(t) + I_X\}$ is higher than the threshold current $I_{th}$ which is defined as a point intersecting the peak of the bias current $I_B(t)$ and the threshold characteristic curve CV5. The number $\underline{m_1}$ of the output pulses which are generated at a positive side of the sum current: $I_f(t) + I_X$ is determined by the following formulae:

$$\frac{1}{f_C I_{CO}} = \frac{T_1}{I_X + I_{CO} - I_{th}} \quad (9a)$$

$$\text{where, } T_1 = \frac{m_1'}{f_B} \quad (9b)$$

$$\therefore m_1' = \frac{f_B}{f_C} \cdot \frac{I_X + I_{CO} - I_{th}}{I_{CO}} \quad (10)$$

Similarly, the number $m_2$ of output pulses which are generated at a negative side of the sum current: $I_f(t) + I_X$ is determined by the following formulae:

$$\frac{1}{f_C I_{CO}} = \frac{T_2}{I_{CO} + I_X - I_{th}} \quad (11a)$$

$$\text{where, } T_2 = \frac{m_2}{f_B} \quad (11b)$$

$$\therefore m_2 = \frac{f_B}{f_C} \cdot \frac{I_{CO} + I_X - I_{th}}{I_{CO}} \quad (12)$$

From the formulas (10) and (12), the measuring current $I_X$ is expressed by the following formula:

$$I_X = (m_1 - m_2) \frac{f_C}{2 f_B} \cdot I_{CO}$$
$$= k_3 \cdot (m_1 - m_2) \quad (13)$$

Formula (13) shows that the measuring current $I_X$ is determined by a deviation between $m_1$ and $m_2$. The deviation can be easily detected by using an up/down (U/D) counter.

Note that, since the up-and down-pulses are commonly subjected to noise, fluctuations, a bias shift in the circuit and other conditions, the deviation $(m_1 - m_2)$ is not affected by the above adverse conditions, and thus an extremely acurate measuring current $I_X$ can be obtained.

Now, a more detailed digital type SQUID magnetometer in which a SQUID and a feedback circuit are integrated in a single chip will be described with reference to FIG. 8.

In FIG. 8, the SQUID magnetometer includes a SQUID 1 consisting of two Josephson junctions $J_1$ and $J_2$ and without shunt resistors, a superconducting loop line having two inductance components $l_{01}$ and $l_{02}$ and three magnetically coupled lines $l_2$, $l_3$ and $l_4$, a pick up coil PC connected to the magnetically coupled line $l_2$, a bias supply circuit 3a, and a digital feedback circuit 4. The bias supply circuit 3a includes an oscillator 10, a Josephson junction pulser a resistor Rd, a control signal generation circuit 14 consisting of a frequency divider 14a and a low pass filter 14b. The feedback circuit 4 includes a counter circuit 16 consisting of a polarity detection circuit 16a and a U/D counter 16b, a controller 22, and a DAC 24.

In the above construction, the oscillator 10 is provided under room temperature conditions and the pick-up coil PC is placed at a portion to be measured, but other circuit elements are formed in a single superconductive IC chip. These superconductive IC circuits will be described later in detail.

The operation of the SQUID magnetometer shown in FIG. 8 will be described.

The oscillator 10 generates an oscillation signal S10 having a sine wave of a frequency $f_B$. The Josephson junction pulser 12 receives the oscillation signal S10 and outputs an alternative pulsed bias current $I_B(t)$ having the frequency $f_B$ and as shown in FIG. 7. The alternative pulsed bias current $I_B(t)$ is supplied to the SQUID 1. Conversely, the frequency divider 14a in the control signal generation circuit 14 receives the oscillation signal S10 having the frequency $f_B$ and outputs a frequency divided signal S14a having a frequency $f_C$ and as shown in FIG. 9a. The low pass filter 14b in the control signal generation circuit 14 receives the frequency divided signal S14a and outputs the (control) current $I_c(t)$ which varies approximately in a triangle wave form, as shown in FIG. 9b and in FIG. 7. The control current $I_c(t)$ is supplied to the magnetically coupled line $l_4$. Upon receipt of the bias current $I_B(t)$ and the control current $I_c(t)$, the SQUID 1 outputs the pulsed output signal $S_{OUT}$ which may comprise $m_1$ positive-polarity pulses and $m_2$ negative-polarity pulses, in accordance with the (10) and (12), and as shown in FIG. 10. The counter circuit 16 receives the pulsed output signal $S_{OUT}$ and outputs an up- and down-counted value $(m_1-m_2)$. Namely, the polarity detection circuit 16a receives the pulsed output signal $S_{OUT}$ and outputs an up signal u when a sign of the pulsed output signal $S_{OUT}$ is positive or a down signal d when a sign of the pulsed output signal $S_{OUT}$ is negative. Upon receipt of the up signal u, the U/D counter 16b increases a counted value therein in response to the number of the pulsed output signal $S_{OUT}$, and upon receipt of the down signal d, the U/D counter 16b decreases the counted value therein in response to the number of the pulsed output signal $S_{OUT}$. Accordingly, the U/D counter 16 outputs an up-and-down counted value $(m_1-m_2)$ as an output of the SQUID magnetometer. A circuit provided outside of the single SQUID chip (not shown) receives the counted value and calculates the equation (13) to obtain the measuring current $I_X$, and the counted value $(m_1-m_2)$ is supplied to the controller 22. The controller 22 digitally calculates a proportional component: P, a differential component: D and/or an integration component: I, respectively expressed by the following formulas:

$$P=K_P(m_1-m_2) \quad (14)$$

$$D=K_P/T_D\cdot\Delta m=k_D\cdot\Delta m \quad (15)$$

$$I=K_P\cdot T_I\cdot\Sigma(m_1-m_2)=K_L\Sigma(m_1-m_2) \quad (16)$$

where, $K_P$ denotes a proportional gain,
$T_D$ denotes a differential time,
$T_I$ denotes an integration time,
$K_D$ denotes a differential gain, and
$K_L$ denotes an integral gain.
$\Delta m=(m_1-m_2)_{-1}-(m_1-m_2)_0$ where, $(m_1-m_2)_0$ denotes a current counted value, and $(m_1-m_2)_{-1}$ denotes a previous counted value.

The proportional, differential and/or integration control is carried out to adjust (compensate) a loop characteristic of the feedback circuit 4. Accordingly, the above control parameters $K_P$, $T_D$ and $T_I$ are determined, by taking the loop characteristic of the feedback circuit into account. The digital sum of the P, I, and D components is supplied to the DAC 24, converting the digital sum to an analog feedback current $I_f$ supplied to the magnetic field junction line $l_3$. The feedback current $I_f$ is defined to maintain the counted value $(m_1-m_2)$ at a constant: $I_y+I_f$: const, and thus obtain the unique $I_X$ by measuring the feedback current $I_f(t)$ or counting the pulses from the SQUID.

A controller 22' can be provided after the DAC 24, instead of the controller 22. The controller 22' is an analog type controller.

The above circuits, except for the oscillator 10 provided outside of the single SQUID magnetometer chip, can be formed as superconducting circuits, as described later.

Figure 11:
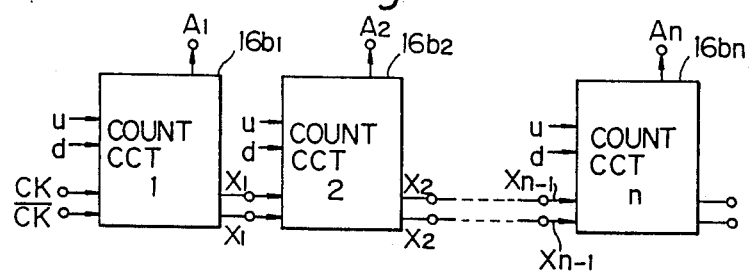
FIG. 11 is a block diagram of an up/down counter shown in FIG. 8.

FIG. 11 is a block diagram of the U/D counter 16b. The U/D counter 16b consists of n counting circuits connected in series. A first counting circuit inputs a clock signal CK and an inverted clock signal $\overline{CK}$ and outputs a first bit (LSB: Least significant bit) $A_1$ of a counted value. A second counting circuit inputs a carry $X_1$ and an inverted carry $\overline{X_1}$ from the first counting circuit and outputs a second bit $A_2$ of the counted value, and so on.

Figure 12:
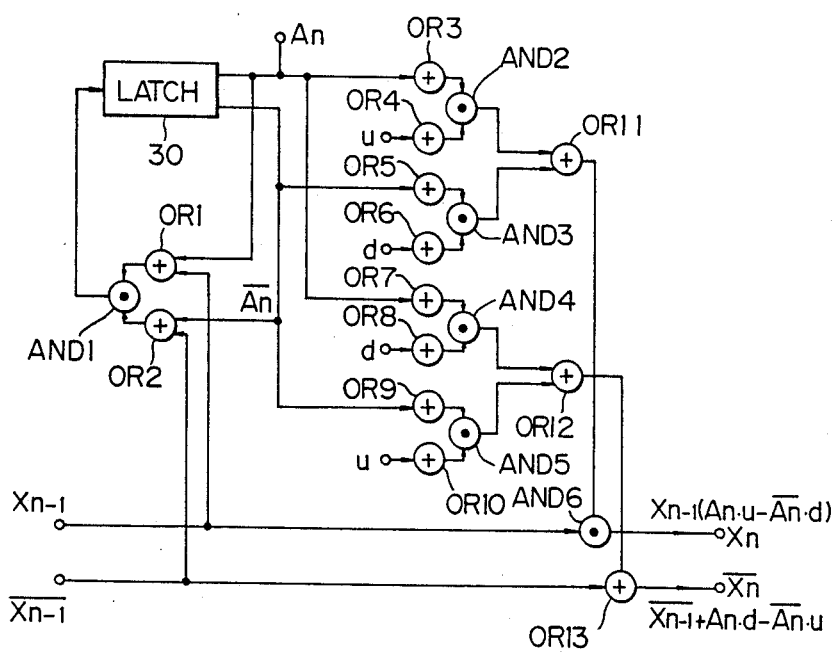
FIG. 12 is a circuit diagram of one counting circuit in the up/down counter shown in FIG. 11 and formed by a superconducting technology.

FIG. 12 is a circuit diagram of a counting circuit shown in FIG. 11. The counting circuit includes a latch circuit 30 shown in FIG. 13, AND gates AND1 to AND6 indicated by dots (•), and OR gates OR1 to OR13 indicated by a + symbol. When the counting circuit is the first counting circuit, i.e., n=1, the inputs $X_{n-1}$ and $\overline{X_{n-1}}$ are the pair of clocks CK and $\overline{CK}$. When the inputs $X_{n-1}$ and $\overline{X_{n-1}}$ are input, a pair of outputs $X_n$ and $\overline{X_n}$ are expressed by the following logical formulae:

$$\overline{X_n}=\overline{X_{n-1}}\cdot(A_n\cdot u+\overline{A_n}\cdot d) \quad (17)$$

$$X_n=X_{n-1}+A_n\cdot d+A_n\cdot u \quad (18)$$

where,
u denotes the incremental counting signal when u=1 (d=0),
d denotes the decremental counting signal when d=1 (u=0), and
$A_n$ and $\overline{A_n}$ denote a pair of positive and inverted outputs from the latch circuit 30.

The output $A_n$ is also defined by the following logical formula:

$$A_n=(X_{n-1}+(A_n)_{-1})\cdot(\overline{X_{n-1}}+(\overline{A_n})_{-1}) \quad (19)$$

where, $(A_n)_{-1}$ and $(\overline{A_n})_{-1}$ denote the output held in the latch circuit 30.

Referring to FIG. 13, the latch circuit 30 comprises OR gates OR31 to OR33, a power supply circuit 30a, and a timed inverter TI31. The power supply circuit 30a includes a power source PWR31 supplying a first-phase power signal $\phi_1$, a first delay circuit DEL 31 delaying the first-phase power signal $\phi_1$ by $2\pi/3$ radian to produce a second-phase power signal $\phi_2$, and a second delay circuit DEL 32 delaying the second-phase power signal $\phi_2$ by $2\pi/3$ radian to produce a third-phase power signal $\phi_3$. The third-phase power signal $\phi_3$ is advanced by $2\pi/3$ radian to the first-phase power signal $\phi_1$. The relationship among the three phase power signals $\phi_1$, $\phi_2$, and $\phi_3$ is shown in FIGS. 14a to 14c. In the SQUID system having the hysteresis characteristic described before (see FIG. 2a), when a bias current exceeds a threshold level the Josephson junction is able to output a voltage state and hold the state until the bias current becomes zero. Each of the OR gates OR31 to OR33 operates in the above mentioned mode. For example, when an input of the OR gate OR31 is "1", and the first-phase power signal $\phi_1$ is supplied and exceeds the threshold level, the first OR gate OR31 latches the input having a "1" state and holds the "1" state until the first-phase power signal $\phi_1$ becomes approximately zero. The OR gates OR32 and OR33 operate in the same way as the OR gate OR31. The timed inverter TI31 delays an output from the OR gate OR32 and inverts the delayed output produced in the inverted latch output $A_n$. The delay time at the timed inverter TL31 is equal to the operation time at the OR gate OR33. The OR gate OR33 outputs the latch output $A_n$.

The delay circuit DEL31 and DEL32 can be provided in or outside of the chip.

Referring back to FIGS. 11 and 12, the operation for increasing the U/D counter 16b will be described. Especially, the operation of the first stage counting circuit will be described. According to the formulas (17) and (18), since $\underline{u}=1$ and $\underline{d}=0$, the logical outputs $X_1$ and $\overline{X}_1$ can be expressed as follows:

$$X_1 = CK \cdot A_1 \tag{20}$$

$$\overline{X}_1 = \overline{CK} + \overline{A}_1 \tag{21}$$

Before supplying a first clock, $CK=0$, $\overline{CK}=1$, and accordingly $A_1=0$, and consequently $$X_1 = 0$$

$$\overline{X}_1 = 1$$

Upon supplying the first clock ($CK=1$ and $\overline{CK}=1$), since the output $A_1$ is still 0, the output of the AND gate AND1, expressed by $(CK+A_1)\cdot(\overline{CK}+\overline{A_1})$, is "1". The output of the AND gate AND1, which is "1" is supplied to the latch circuit 30 and delayed by three-phase power signals $\phi_1$ to $\phi_3$, and $A_1=1$ is output from the latch circuit 30 after the delay. The OR gates OR1 to OR13 and the AND gates AND1 to AND6 in FIG. 12 are operated by the first-phase power signal $\phi_1$. The bias supply circuit is synchronised with the power signal $\phi_1$.

When a second clock is supplied ($CK=1$) the output of the AND gate AND1 becomes "0" since $A_1=1$ and $\overline{A_1}=0$, the output of "0" is supplied to the latch circuit 30 and the output $A_1$ of "0" is output after the three-phase delay. At the time that the second clock is supplied, $A_1=0$, and thus the outputs become $X_1=1$ and $\overline{X}_1=0$.

When a third clock is supplied, the output from the AND gate AND1 becomes "1" since $A_1=0$ and $\overline{A_1}=1$. The output of "1" is supplied to the latch circuit 30 and the output $A_1$ of "1" is output after the three phase delay. The outputs become $\overline{X}_1=0$ and $\overline{X}_1=1$.

The output $A_1$ becomes 0, 1, 0, 1, 0, 1 ..., and the carry output $X_1$ becomes 0, 0, 1, 0, 1 ... The second counting circuit receives and counts the carry output $X_1$ and outputs the output $A_2$ of 0, 0, 1, 1, 0, 0, ... The other counting circuits operate in the same way.

When the U/D counter 16b operates to decrease the counted value (down count), $\underline{u}=0$ and $\underline{d}=1$, and thus borrow outputs $X_n$ and $\overline{X}_n$ are expressed as follows.

$$X_n = X_{n-1}\overline{A}_n \tag{22}$$

$$\overline{X}_n = \overline{X_{n-1}} + A_n \tag{23}$$

Figure 15:
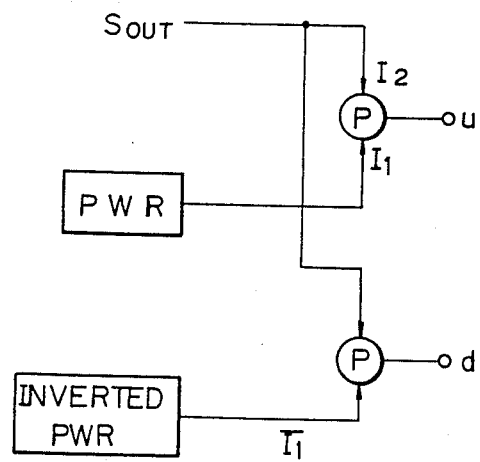
FIG. 15 is a circuit diagram of a polarity detection circuit shown in FIG. 8.
Figure 16:
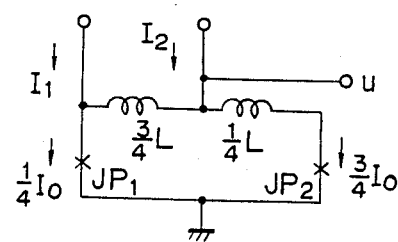
FIG. 16 is a circuit diagram of a polarity inversion gate shown in FIG. 5.

FIG. 15 shows a circuit diagram of the polarity detection circuit 16a. The polarity detection circuit 16a is a digital type polarity detection circuit and polarity inversion gates P each of which is shown in FIG. 16, a power supply PWR and an inverted power supply. FIGS. 17a to 17e are timing charts of the circuit 16a. FIG. 18 is a graph explaining the operation of the circuit 16a. At points $P_1$ and $P_2$ positive polarity pulses are output, at points $P_3$ and $P_4$ no pulse is output, and at points $P_5$ and $P_6$ negative polarity pulses are output.

FIG. 19 shows a circuit diagram of the Josephson junction pulser 12 shown in FIG. 8. The Josephson junction pulser 12 shown in FIG. 19 comprises a resistor R12, a Josephson junction J12$_3$, connected in series to the resistor R12 and a SQUID, and two series-connected Josephson junctions J12$_1$ and J12$_2$. The Josephson junction pulser and the operation thereof are described in JPA No. 63-149914.

Figure 20:
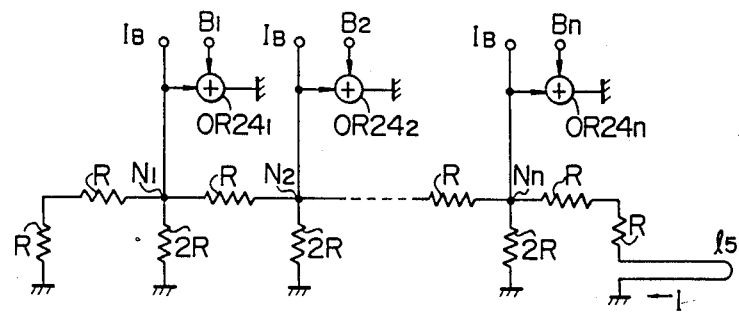
FIGS. 20 to 22 are circuit diagrams of a digital to analog converter shown in FIG. 8.
Figure 21:
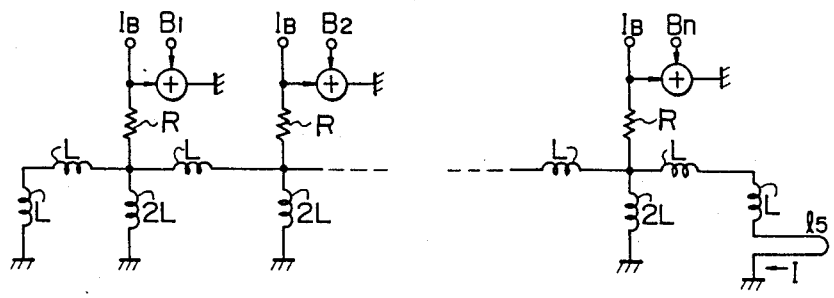
Figure 22:
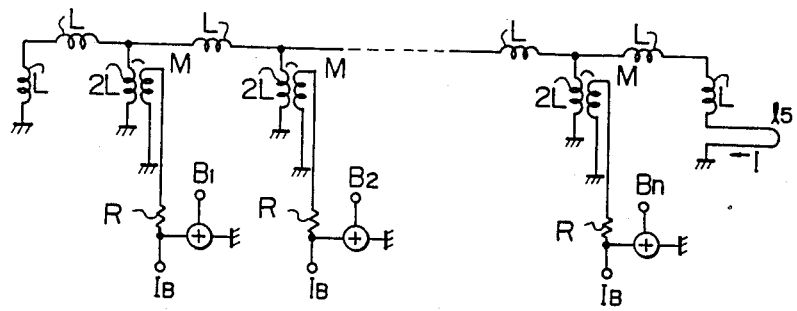

FIGS. 20 to 22 are circuit diagrams of the DAC 24 shown in FIG. 8.

The DAC shown in FIG. 20 is a R-2R ladder type DAC. In FIG. 20, currents supplied to nodes $N_1$ and $N_n$ are controlled by OR gates OR24$_1$ to OR24$_n$ which are formed by Josephson junctions. Reference R denotes a resistor having a resistance R, 2R denotes a resistor having a resistance 2R, $B_1$ to $B_n$ denote respective bits of a digital input, expressed by a power of 2: $B_1=2^0$, $B_2=2^1$, ..., $B_n=2^{n-1}$, and $I_B$ denotes a bias current in the DAC. When the bit $B_1$ is "0", the OR gate OR24, is in a zero-voltage state, and thus all of the bias current $I_B$ flow through the OR gate OR24 and is grounded. Conversely, when the bit $B_1$ is "1", the OR gate OR24 is in a voltage output state, and thus the bias current $I_B$ flows into the node $N_1$. Each node is equivalently grounded through three of the resistors 2R, and accordingly, when the bias current $I_B$ flows into the node $N_n$, a current of $I_B/3$ flows into each resistor 2R, and thus a current $(I_{Bpk}/3)B_n$ flows through an output line $l_5$. With regard to $B_{n-1}$, a current which is a half of the current $I_B/3$ flowing into the node $N_n$, i.e. $I_B/6$, flows into the output line $l_5$, and with regard to $B_{n-2}$, a current $I_B/12$ flows into the output line $l_5$. Consequently, the current I flowing in the output line $l_5$ is expressed by the following formula:

$$I = \frac{I_B}{3}\left(B_n + \frac{B_{n-1}}{2} + \ldots + \frac{B_1}{2^{n-1}}\right) \tag{24}$$

Namely, the DAC shown in FIG. 20 is an n bits binary DAC in which the bit $B_1$ indicates a LSB and the bit $B_n$ indicates a MSB.

The resistors R and 2R in FIG. 20 can be replaced by superconducting inductances L and 2L as shown in FIG. 21. Note these superconducting inductances can be easily realized. The current I flowing through the output line $l_5$ is also expressed by the above formula (24).

Furthermore, the DAC can be realized by a circuit shown in FIG. 22, which uses mutual inductances M. A current I flowing in the output line $\underline{l_5}$ in FIG. 22 is expressed by the following formula:

$$I = \frac{I_B}{6L} M \left(B_n + \frac{B_{n-1}}{2} + \ldots + \frac{B_1}{2^{n-1}}\right) \tag{25}$$

Figure 23:
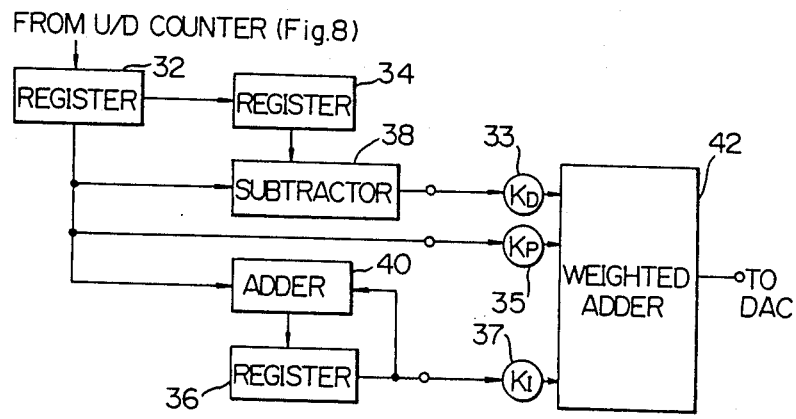
FIG. 23 is a block diagram of a controller shown in FIG. 8.

FIG. 23 shows a block diagram of the controller 22 shown in FIG. 8. The controller 22 includes registers 32, 34, and 36, a subtracter 38, an adder 40, coefficient circuits 33, 35 and 37, and a weighted adder 42. The coefficient circuits 33, 35 and 37 give the differential gain $K_D$ for a differential component expressed in the formula (15), the proportional gain $K_P$ expressed in the formula (14), and the integral gain $K_L$ express in the formula (16), respectively. The resistor 32 and the coefficient circuit 35 provide the proportional component P, expressed by the formula (14). The register 34 holds a previous up-and-down counted value, and the registers 32 and 34 and the subtracter 38 calculate a differential, and cooperates with the coefficient circuit 33 to provide the differential component D, expressed by the formula (15). The adder 40 and the register 36 cooperate and function as an integrator. The integrator cooperates with the coefficient circuit 37 to provide the integral component I, expressed by the formula (16). The weighted adder 42 adds the above proportional, differential and integral components. The registers 32, 34, and 36, the subtracter 38, the adder 40 and the weighted adder 42 are digital circuits, and thus can be formed by a superconducting circuit.

Figure 24:
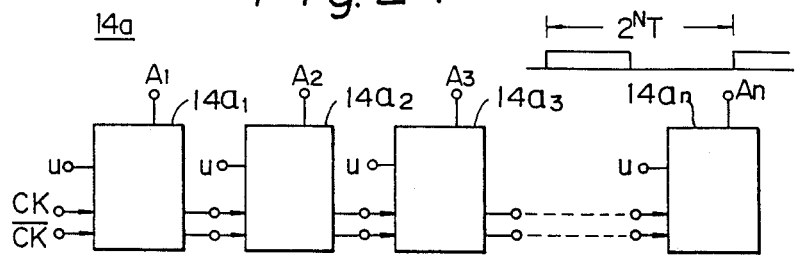
FIG. 24 is a block diagram of a frequency divider shown in FIG. 8.
Figure 25:
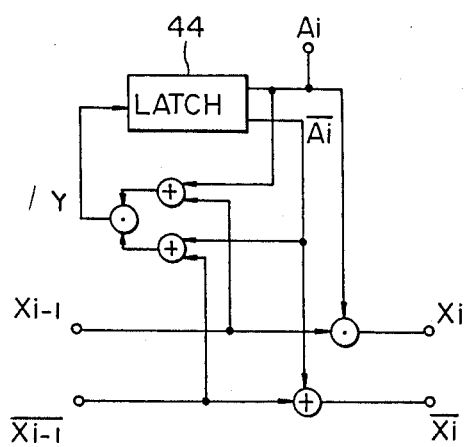
FIG. 25 is a circuit diagram of one circuit of the frequency divider shown in FIG. 24.

FIG. 24 is a block diagram of the frequency divider 14a shown in FIG. 8. The frequency divider 14a consists of n step counting circuits $14a_1$ to $14a_n$. FIG. 25 is a circuit diagram of a counting circuit of the frequency divider 14a shown in FIG. 24. The counting circuit shown in FIG. 25 is realized by using the counting circuit shown in FIG. 12 of the U/D counter 16b, but since $\underline{u}=1$ and $\underline{d}=0$, the counting circuit for the frequency divider $\overline{14}a$ is very simple as shown in FIG. 25. In FIG. 24, when the oscillation signal S10 and the inverted oscillation signal $\overline{S10}$, both having the frequency $f_B$ and being clocks CK and $\overline{CK}$ are supplied to the first counting circuit $14a_1$ of the frequency divider 14a, an output An of the last counting circuit $14a_n$ is a signal having a frequency $f_C = 2^n \cdot f_B$. In practice, since the clock signal ck is high level, each clock: CK=1, $\overline{CK}$=0, and S10 is not necessary. In FIG. 25, the following formulae stand.

$$X_{i-1} = CK \cdot A_1 \cdot A_2 \cdots A_{i-1} \quad (26a)$$

$$\overline{X_{i-1}} = \overline{CK} + \overline{A_1} + \overline{A_2} \cdots \overline{A_{i-1}} \quad (26b)$$

$$X_i = CK \cdot A_1 \cdot A_2 \cdots A_{i-1} \cdot A_i \quad (27a)$$

$$\overline{X_i} = \overline{CK} + \overline{A_1} + \overline{A_2} \cdots \overline{A_{i-1}} + \overline{A_i} \quad (27b)$$

$$Y = (A_i + X_{i-1}) \cdot (\overline{A_i} + \overline{X_{i-1}}) = A_i \oplus X_{i-1} \quad (28)$$

where,
· indicates an AND operation,
+ indicates an OR operation,
⊕ indicates an Exclusive OR operation, and
Y denotes an input of a latch circuit 44.

As described above, the counting circuit shown in FIG. 22 functions as a delay type flip flop in which an output is fed back to an input terminal to enable a functioning of a ½ frequency divider.

Figure 26:
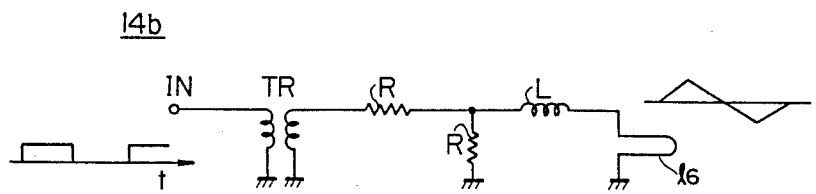
FIG. 26 is a circuit diagram of a low pass filter shown in FIG. 8.

FIG. 26 is a circuit diagram of the low pass filter 14b shown in FIG. 8. The low pass filter 14b consists of a superconducting transformer TR, resistors R, an inductor L and an output line $l_6$. A time constant defined by the resistor R and the inductor L is sufficiently large. Accordingly, the input frequency divided signal is converted into a triangle wave current; i.e. the control current $I_c$.

Referring back to FIG. 8, the feedback current $I_f$ can be supplied to the magnetically coupled line $l_4$ as shown by a dotted line and the magnetically coupled line $l_3$ can be omitted. In this case, a capacitor 26 for rejecting a DC component of the feedback current $I_f$ to the low pass filter 14b should be provided between the magnetically coupled line $l_4$ and the low pass filter 14b.

Again referring back to FIG. 8, the PID controller 22 or 22' is not an essential component in the feedback circuit 4, and thus can be omitted.

In a modification circuit, two oscillators are provided, one generating a signal having the frequency $f_B$, and another generating the other signal having the frequency $f_C$, instead of the oscillator 10 shown in FIG. 8. In this case, the frequency divider 14a can be omitted.

When a plurality of SQUID magnetometers are to be integrated in a single chip, the Josephson junction pulser 12 and the control signal generation circuit 14 shown in FIG. 8, and commonly used with the plurality of SQUID magnetometers, can be provided outside of the single chip.

Also, in FIG. 8, the Josephson junction pulser 12 can be omitted.

A second embodiment of a digital D.C. SQUID system in accordance with the present invention will be described with reference to FIG. 27.

Figure 27:
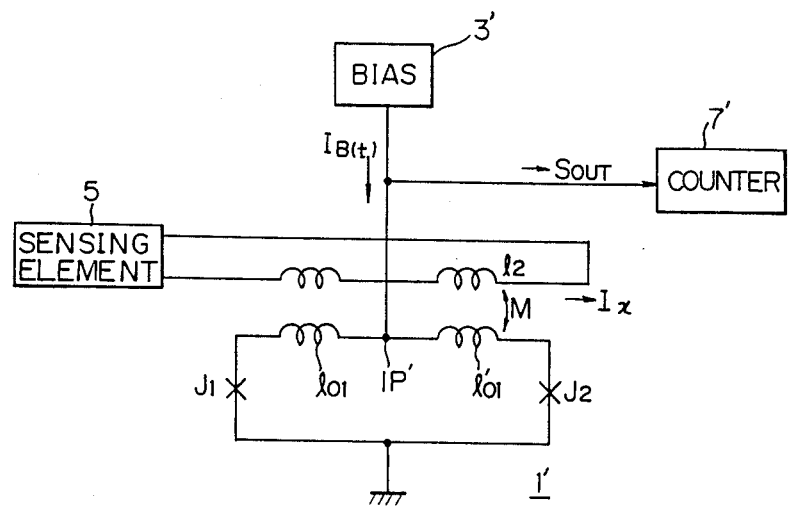
FIG. 27 is a block diagram of a digital SQUID system of a second embodiment in accordance with the present invention.

In FIG. 27, the SQUID system includes a SQUID 1' having two Josephson junctions $J_1$ and $J_2$, two inductance components $l_{01}$ and $l'_{01}$ in a superconducting line, and a magnetically coupled line $l_2$ magnetically coupled to the inductance components $l_{01}$ and $l'_{01}$ by a mutual inductance coefficient M. The SQUID system further includes a bias supply circuit 3' and a measurement circuit 7' which are integrated in a single superconducting chip together with the SQUID. The SQUID system includes the pick up coil 5 connected to the magnetically coupled line $l_2$. Note that the control current $I_c(t)$ shown in FIG. 5 is not supplied.

Figure 28:
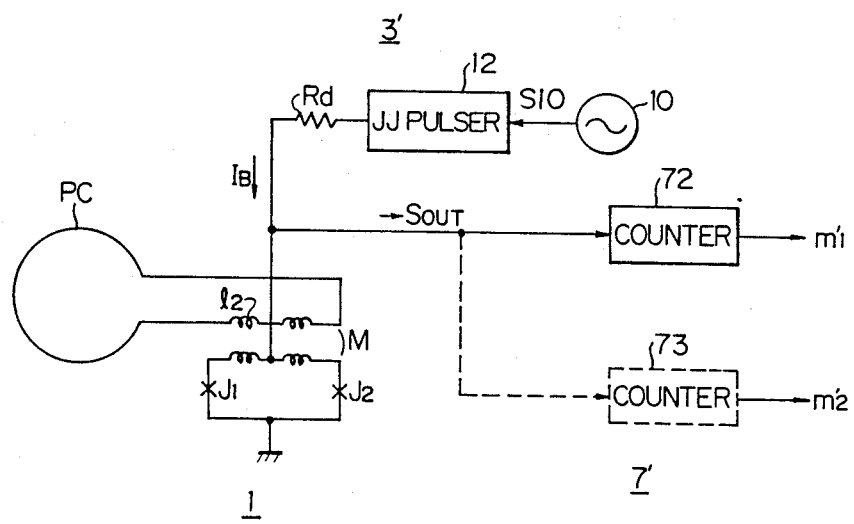
FIG. 28 is a circuit diagram of the digital DC type SQUID system shown in FIG. 27.

FIG. 28 shows a circuit diagram of the SQUID system shown in FIG. 27. The bias supply circuit 3' consists of the oscillator 10 provided outside of the superconducting chip, the Josephson junction pulser 12 as shown in FIG. 19 and the resistor Rd. The Josephson junction pulser 12 and the resistor Rd are formed by a superconducting technology and integrated in the single superconducting chip. The bias supply circuit 3' is substantially identical to that shown in FIG. 8, and thus supplies the bias current $I_B(t)$ having an alternative pulse form, as shown in FIG. 26. The measurement circuit 7' consists of a counter 72.

The operation of the SQUID system shown in FIG. 28 will be described with reference to FIGS. 29a to 29d.

First, a threshold characteristic curve CV7 can be selected as shown in FIG. 29b which corresponds to the threshold characteristic curve CV6, shown in FIG. 7. The selection of the threshold characteristic curve CV7 can be achieved by changing the critical current ratio, the inductance, and/or an injection point IP' for injecting the bias current: $l_{01} \neq l'_{01}$, as described with reference to FIG. 7. Second, an amplitude $I_{BMX}$ of a positive polarity of the bias current $I_B(t)$ is adjusted to be approximately equal to or slightly lower than a positive critical current $I_M$ of the SQUID 1'.

Under these conditions, during the application of the positive polarity of pulses of the bias current $I_B(t)$ to the SQUID 1', when the positive measuring current $I_X$ is supplied to the magnetically coupled line $l_2$ from the pick-up coil PC, the output signal $S_{OUT}$ which comprises $m'_1$ pulses as shown in FIG. 29C can be output. The frequency of the pulses of the output signal $S_{OUT}$ is equal to the frequency $f_B$ of the bias pulse $I_B(t)$.

In the above first example, the measuring of the positive polarity of the measuring current $I_X$ was described. When a measurement of the negative polarity of the measuring current $I_X$ is necessary, it should be designed as follows:

(a) the bias supply circuit 3 outputs a negative polarity of the bias pulse current, as shown by a dotted line in FIG. 29a.

(b) an amplitude $(-I_{BMX})$ of the bias pulse current $I_B(x)$ is adjusted to be approximately equal to or slightly higher than an amplitude $(-I_M)$ of the critical current of the threshold characteristic, and (c) the measurement circuit 7' includes the counter 73 for counting output pulses $\underline{m'_2}$ of the output signal $S_{OUT}$, having a negative polarity.

The operational principle of this example is substantially the same as that of the above first example.

The SQUID system shown in FIG. 30 also can be expanded to measure positive and negative polarities of the measuring current $I_X$. In this case, as shown in FIG. 30 the measurement circuit 7a includes the polarity detection circuit 71 and the U/D counters 74. The relationship between the currents $I_{BMX}$ and $I_M$, and the currents $(-I_{BMX})$ and $(-I_M)$ are the same as described above. The polarity detection circuit 71 detects the polarity of the output signal $S_{OUT}$ and energizes a positive input terminal of the U/D counter 74 when the polarity is positive or a negative input terminal of the U/D counter 74 when the polarity is negative.

Also, a magnetically coupled line . . . a superconducting storage loop portion 22 shown in FIG. 35 (described later) can be added to the constitution shown in FIG. 28 or FIG. 30.

Figure 37:
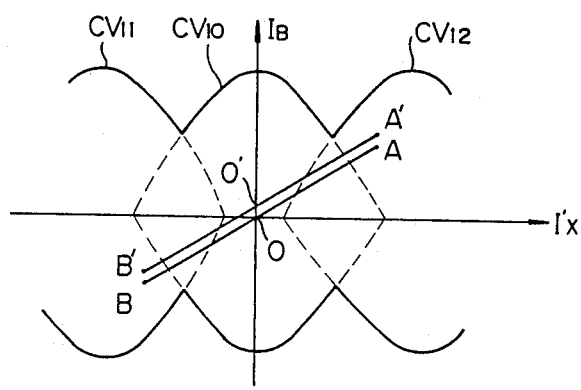
FIG. 37 is a graph showing the operation of the SQUID system shown in FIG. 36.

A third embodiment of a SQUID system will be described with reference to FIGS. 37 to 34.

Before describing the third embodiment, the characteristics shown in FIG. 7 will be reviewed. When a center $I_{CC}$ of the triangle-wave of the control current $I_C(t)$ is zero, the number $m_1$ of the output pulses is equal to the number $m_2$ of the output pulses. Conversely, when the center $I_{CC}$ of the triangle-wave of the control current $I_C(t)$ is shifted to a positive side: $I_{CC} > 0$, as shown in FIG. 7, the number $m_1$ of the output pulses is greater than the number $m'_2$ of the output pulses. In both cases, the U/D counter 16b shown in FIG. 8 first counts up the $m'_1$ pulses and then counts down the $m'_2$ pulses. As described above, the final counted value is $(m_1 - m_2)$, but usually the U/D counter 16b must have an approximately 13 to 14 bit length, for counting up $m_1$, approximately $10^4$. Consequently, a complex circuit construction is needed when forming the U/D counter 16b. Occasionally, the DAC 24 and the controller 22 must be able to treat many bits. In practice, when a dynamic range of the magnetic flux to be measured is not too large, the final counted value may be approximately $10^2$, and thus the bit length of the U/D counter 16b can be reduced to approximately eight to nine bits. The above problem can be solved by the SQUID system shown in FIG. 27, because the U/D counter 74 alternatively increases the positive polarity pulses and decreases the negative polarity pulses, as shown in FIGS. 26c and 26d. The third embodiment will also solve the above problem.

In addition, even in the second embodiment shown in FIGS. 25 to 27, the design and the production by which the amplitude $I_{BMX}$ of the bias pulse current $I_B(t)$ is made approximately equal to the amplitude $I_M$ of the critical current is very difficult. The third embodiment will also solve this problem.

Figures 32A, 32B:
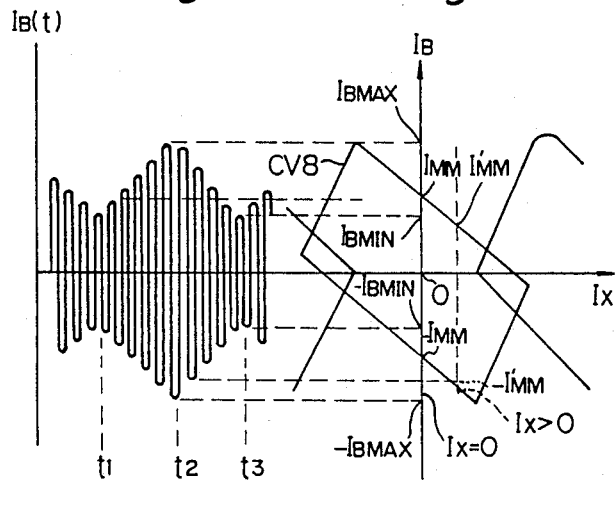
FIGS. 32a to 32d are graphs explaining the operation of the SQUID system shown in FIG. 31.

Referring to FIG. 31, the SQUID system comprises a DC SQUID 1' consisting of two Josephson junctions $J_1$ and $J_2$, inductance components $l'_0$ and $l''_0$ and a magnetically coupled line $l_2$, a bias supply circuit 3", a U/D counter 80, and the pick-up coil PC. An injection point IP' to which a bias current $I_B(t)$ from the bias supply circuit 3" is injected is shifted from a center of a superconducting loop to defer an inductance $L'_{01}$ of the inductance component $l'_{01}$ and an inductance $L''_{01}$ of the inductance component $l''_{01}$, thus obtaining a threshold characteristic curve CV8 shown in FIG. 32a which is asymmetric with respect to an origin 0 of the coordinates. In FIG. 32b, absolute values of positive and negative critical currents $I_{MM}$ and $(-I_{MM})$ are substantially equal.

The bias supply circuit 3" generates an amplitude modulated (AM) pulsed bias current $I_B(t)$ as shown in FIG. 32a. The AM pulsed bias current $I_B$ has the minimum amplitudes $I_{BMIN}$ and $(-I_{BMIN})$ at times t1 and t3 and the maximum amplitudes $I_{BMAX}$ and $(-I_{BMAX})$ at a time t2. As shown in FIGS. 32a and 32b, the total positive critical current $I_{MM}$ is within the currents $I_{BMAX}$ and $I_{BMIN}$, and the total negative critical current $(-I_{MM})$ bias between the currents $(-I_{BMIN})$ and $(I_{BMAX})$.

Figure 32C:
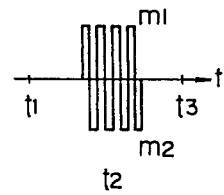
Figure 32D:
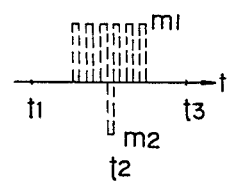

When the measuring current $I_X$ is zero volt, a characteristic vertical line is shown by a solid line in FIG. 32b. In this case, as shown in FIG. 32c, equal positive and negative pulses $m_1$ and $m_2$ are alternatively output as the output signal $S_{OUT}$. The U/D counter 80 counts these pulses up and down and may output a zero counted value. When the measuring current $I_X$ is positive, the operating point trajectory is shown by a dotted line in FIG. 32b. In this case, a total positive critical current $I'_{MM}$ differs from a total negative critical current $-I'_{MM}$ and $|I'_{MM}| < |-I'_{MM}|$. Accordingly, as shown in FIG. 32d by dotted lines, the output signal $S_{OUT}$ comprises many positive pulses $\underline{m_1}$ and few negative pulses $\underline{m_2}$. A difference between $(m_1 - m_2)$ calculated at the U/D counter 80 is proportional to the measuring current $I_X$.

Figure 33:
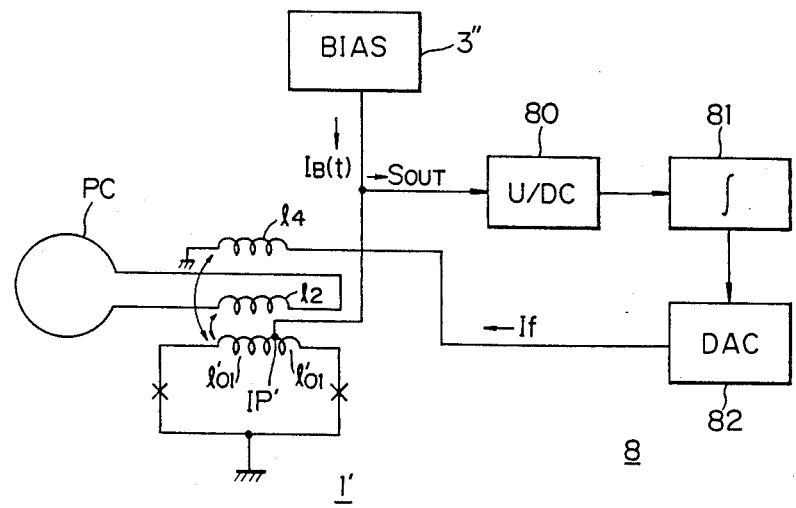
FIG. 33 is a block diagram of a digital SQUID system which is a modification of the digital SQUID system shown in FIG. 31.

More preferably, a SQUID system shown in FIG. 33 can be formed. A SQUID 1' shown in FIG. 33 is further provided with a magnetically coupled line $l_4$ carrying a feedback current $I_f$ in addition to the SQUID 1 shown in FIG. 31. A feedback circuit 8 is also provided. The feedback circuit 8 includes an integrator 81 and a DAC 82 in addition to the U/D counter 80 shown in FIG. 31. The integrator 81 is provided to stabilize (average) an output from the U/D counter 80, and thus provide a stabilized feedback current $I_f$ through the DAC 82. The integrator 81 can be ommited.

Figure 34:
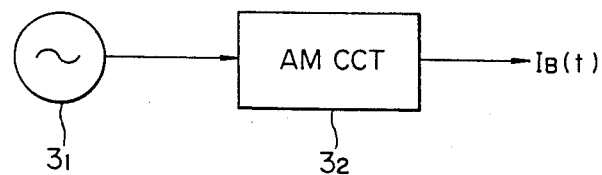
FIG. 34 is a block diagram of a bias supply circuit shown in FIGS. 31 and 33.

FIG. 34 shows a block diagram of the bias supply circuit 3" shown in FIGS. 31 and 33. The bias supply circuit 3" comprises an oscillator $3_1$ provided outside of a superconducting chip and an AM circuit $3_2$ provided inside of the superconducting chip. The AM circuit $3_2$, per se, can be formed by a variety of circuit technologies.

A fourth embodiment of a SQUID system in accordance with the present invention will be described.

Referring back to FIGS. 11 to 13, the circuit construction of the U/D counter is relatively complex. If the U/D counter, which is required to count many counting pulses, is needed, the U/D counter must have many counting circuits, each shown in FIGS. 12 and 13, and accordingly, many Josephson junctions must be formed in a single chip. The above is the same for the DAC because the circuit construction of the DAC is relatively complex, as shown in FIGS. 17 to 19. The fourth embodiment solves these problems.

First, a principle of the fourth SQUID system will be described with reference to FIG. 35.

Figure 35:
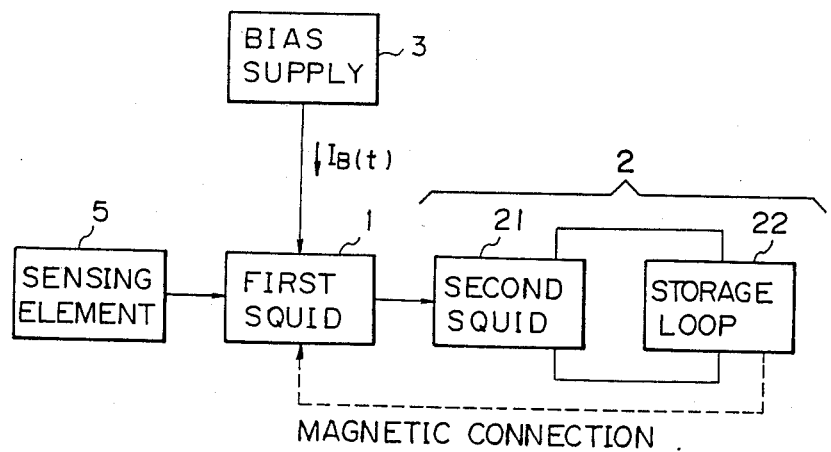
FIG. 35 is a block diagram of a digital SQUID system of a fourth embodiment in accordance with the present invention.

In FIG. 35, the SQUID system comprises a second SQUID 21, which includes two Josephson junctions, and an additional superconducting loop portion (or a superconducting storage loop portion) 22. The first SQUID 1, the bias supply circuit 3 and the sensing element 5 are similar to those described above.

The feedback circuit of the digital SQUID system is used to calculate a difference between positive and negative pulses output from the first SQUID and to provide a feedback current proportional to the above difference to the first SQUID. The second SQUID 21 and the additional superconducting loop portion 22 performs the above function.

The bias supply circuit 3 and the first SQUID 1 are designed such that they can cooperate to output pulses proportional to a current detected by the sensing element 5. Upon receipt of a single positive pulse output from the first SQUID 1, the second SQUID portion 21 gives a single flux quantum $\Phi_0$ to the additional superconducting loop portion in the second SQUID portion 2. Since the additional superconducting loop portion 22 has a latching function, the additional superconducting loop portion 22 stores the flux quantum $\Phi_0$. Conversely, upon receipt of a single negative pulse, the second SQUID 21 extracts a single flux quantum $\Phi_0$ from the additional superconducting loop portion in the second SQUID portion 2. As can be seen, the second DC SQUID 21 and the additional superconducting loop portion 22 cooperate to function as a up-and-down counter. Furthermore, the additional superconducting loop portion is magnetically coupled to the first superconducting loop in the first SQUID portion 1, and feeds a feedback signal proportional to the stored flux quantum to the first superconducting loop.

Figure 36:
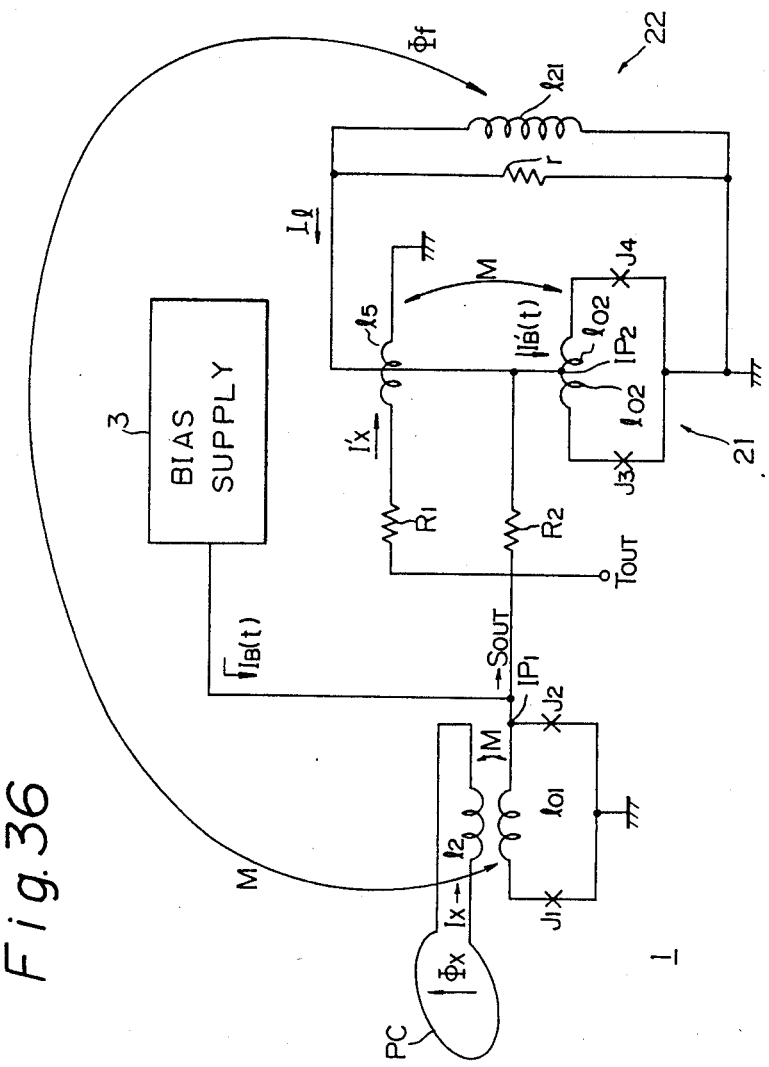
FIG. 36 is a circuit diagram of a digital SQUID system shown in FIG. 35.

FIG. 36 shows a circuit diagram of a specific embodiment of the SQUID system shown in FIG. 35. In FIG. 36, the first SQUID 1 comprises the two Josephson junctions $J_1$ and $J_2$, the first superconducting loop $l_{01}$, and the magnetically coupled line $l_2$ connected to the pick-up coil PC. The second SQUID portion 2 comprise the second SQUID 21 and the additional superconducting loop portion 22. The second SQUID 21 comprises two Josephson junctions $J_3$ and $J_4$, the second superconducting loop $l_{02}$, an additional magnetic field junction line $l_5$ magnetically coupled to the second superconducting loop $l_{02}$, and resistors R1 and R2. The additional superconducting loop portion 22 comprises an additional superconducting line $l_{21}$ and a damping resistor r. The additional superconducting line $l_{21}$ is magnetically coupled to the first superconducting loop line $l_{01}$ in the first SQUID 1.

The bias current $I_B(t)$ is injected into an injection point IP1 placed at an asymmetric portion in the first superconducting loop $l_{01}$ of the first SQUID 1 to obtain an asymmetric threshold characteristic. The injection point IP1 is also an output terminal. The bias current $I_B(t)$ may be as shown in FIG. 32a. The first SQUID 1 outputs the output signal $S_{OUT}$ which comprises pulses corresponding to a difference between a magnetic flux to be measured $\Phi_X$ and a feedback magnetic flux $\Phi_f$ from the additional superconducting loop $l_{21}$. When the feedback magnetic flux $\Phi_f$ has a positive polarity, the number of the positive pulses is larger than the number of the negative pulses, or vice versa. The output pulses are output through an output terminal $T_{OUT}$, and supplied to the second SQUID 21. The resistors R1 and R2 separate the output pulses. A signal through the resistor R2 functions as a bias current for the second SQUID 21. The bias current is injected to an injection point IP2 in the second superconducting loop $l_{02}$, which is placed at a center of the second superconducting loop $l_{02}$. The magnetically coupled line $l_5$ functions as the measuring line $l_2$ in the first SQUID 1. Accordingly, a signal through the resistor R1 functions as a measuring current for the second superconducting loop $l_{02}$. Consequently, pulses are output from the injection point IP2 and supplied to the additional superconducting loop portion 22. Note that the pulses are transiently generated, and are not steadily output. The damping resistor r is provided to avoid an overshoot or a change of the loop current when the flux quantum is added to or extracted from the additional superconducting loop $l_{21}$. The additional superconducting loop $l_{21}$ stores the flux quantum and outputs the feedback flux $\Phi_f$, corresponding to the stored flux quantum, to the first superconducting loop $l_{01}$ in the first SQUID 1.

The resistance of the resistors R1 and R2, the relationship between the magnetically coupled line $l_5$ and the second superconducting loop $l_{02}$, and the characteristic of the Josephson junctions $J_3$ and $J_4$ are designed to output a single positive or negative polarity of the magnetic flux in response to a single positive or negative polarity of the pulse output from the first SQUID 1.

Referring to FIG. 36, the operation of the SQUID system shown in FIG. 35 will be more specifically described. FIG. 37 shows a threshold characteristic of the second SQUID 21. In the threshold characteristics represented by solid lines, when an operation point exceeds an origin 0, the characteristic of the second SQUID 21 is switched to the voltage output state. On the other hand, in the characteristics represented by dotted lines, since the threshold characteristics overlap, when the operation point exceeds the threshold, the second SQUID 21 is not transferred to the voltage output state, but is shifted to an adjacent threshold characteristics zone.

When the current is not passed through the second superconducting loop $l_{02}$, the operation point of the second SQUID 21 is placed at the origin O. When the positive pulse is supplied to the second SQUID 21, the positive pulse is separated by the resistors R1 and R2, and the operation point is moved to points O→A→O. The operation point crosses the thresholds which are represented by the dotted lines and indicate a mode transition. Consequently, a single positive flux quantum is stored into the additional superconducting loop $l_{21}$. More specifically, upon supplying a single positive pulse to the second SQUID 21, at a rising point of the input pulse, the operation point exceeds the characteristic on the curve CV10 and represented by the dotted line: motion O→A, and thus the Josephson junction $J_3$ in the second SQUID 21 is instantaneously and temporarily brought into the voltage output state and restored to the zero voltage output state. During the above operation, a single flux quantum $\Phi_0$ is introduced into the second SQUID 21. At a trailing point of the input pulse, the operation point exceeds the characteristic on the curve $CV_{12}$ and represented by the dotted line: motion A→O, and thus the Josephson junction $J_4$ in the second SQUID 21 is instantaneously and temporarily brought to the voltage output state, outputting the flux quantum $\Phi_0$ stored in the second SQUID 21 to the additional superconducting loop portion 22.

Similarly, when the negative polarity of pulses is supplied, the operation point is moved to the points O→B→O in a third zone in FIG. 36, and a single negative polarity of the flux quantum is stored into the additional superconducting loop portion 22; namely, the single flux quantum is extracted from the additional superconducting loop portion 22.

Upon storing the flux quantum in the additional superconducting loop $l_{21}$, a loop current $I_l$ flows and this loop current $I_l$ is superimposed on a second bias current $I'_B(t)$ injected to the second superconducting loop $l_{02}$. As a result, the characteristic of the second SQUID 21 is changed, and the operation point is moved to the points O'→A'→O', or O'→B'→O'.

The loop current $I_l$ is expressed by the following formula:

$$I_l = \frac{n\phi_0}{L_{21}} \qquad (29)$$

where, n represents, the number of the flux quantum, and $L_{21}$ represents an inductance of the additional superconducting loop $l_{21}$.

The total injection current to the injection point IP2 is $I'_B(t) + I_l$, and accordingly, the point O' is shifted up from the origin O. Even if the point O' is greatly shifted from the origin O, the introduction of the flux quantum to and the extraction of the flux quantum from the additional superconducting loop $l_{21}$ becomes different or a malfunction of the second SQUID 21, for example, a transfer to the voltage output state, may occur. These problems can be overcome by increasing the inductance $L_{21}$ of the additional superconducting loop $l_{21}$. The increase of the inductance $L_{21}$ reduces the loop current $I_l$ as expressed by the formula (29) and moves the point O' to the origin O.

The flux quantum corresponding to the number of the output pulses from the first SQUID 1 is stored in the additional superconducting loop $l_{21}$ and the loop current $I_l$ proportional to the stored flux quantum flows. The feedback flux $\Phi_f$ corresponding to the loop current $I_l$ is magnetically coupled to the first superconducting loop $l_{01}$. The first SQUID 1 outputs the pulses until the sum of $\Phi_x$ and $\Phi_f$ becomes zero. When the sum is negative, the positive polarity pulses are output to increase $\Phi_f$, or vice versa, so that the null method is carried out. This feedback magnetic flux $\Phi_f$ may cancel the magnetic flux coupled from the magnetically coupled line $l_2$. Accordingly, this feedback magnetic flux or the loop current $I_l$ indicates the magnetic flux detected by the pick-up coil PC. The measurement current can be read by the loop current of the output pulse from the first SQUID 1.

Referring to FIG. 35, the second SQUID portion 2 can be formed by the superconducting circuit as the first SQUID 1, and accordingly, the first SQUID 1 and the second SQUID portion 2 can be integrated in a single superconductive chip. Also, multiple first and second SQUIDs can be integrated in a single chip.

Figure 38:
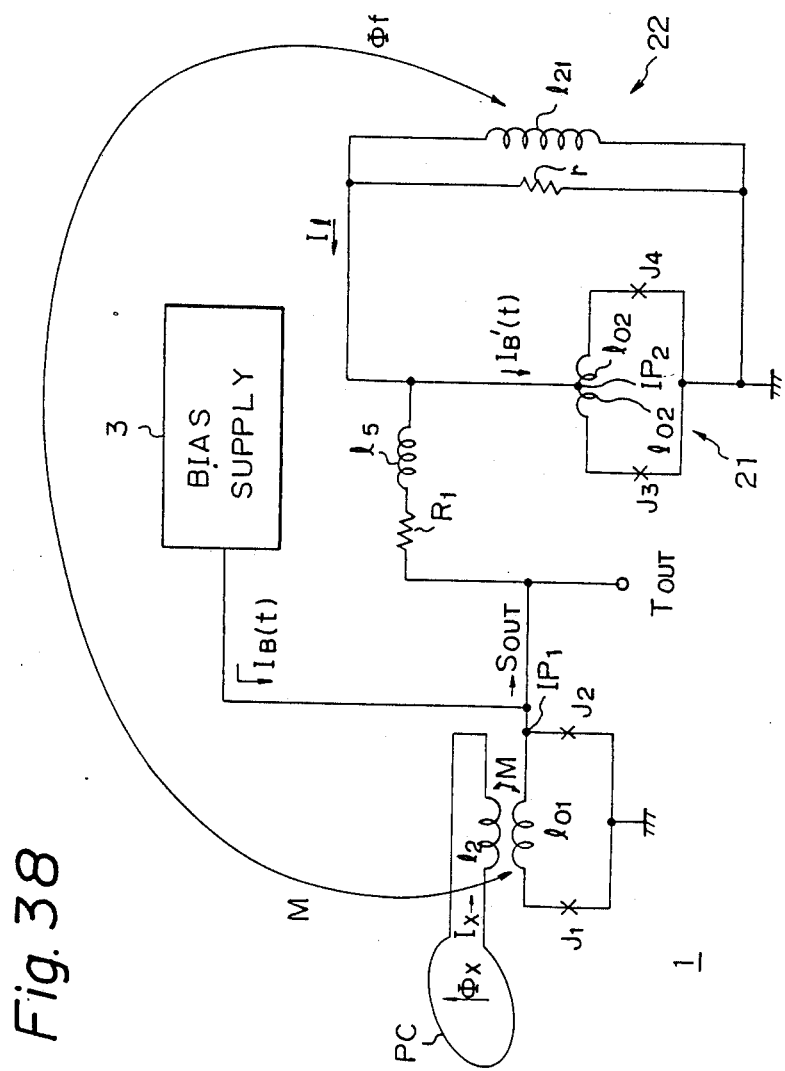
FIG. 38 is a circuit diagram of another digital type SQUID system shown in FIG. 35.

FIG. 38 is a circuit diagram of another embodiment of the SQUID system shown in FIG. 36, the resistor $R_2$ is omitted, the magnetically coupled line $l_5$ and the additional superconducting loop portion 22 are connected, and a commonly connected point is connected to the injection point $IP_2$. The operation is similar to the circuit shown in FIG. 36

Many widely different embodiments of the present invention may be constructed without departing from the spirit and scope of the present invention. It should be understood that the present invention is not limited to the specific embodiments described in this specification, except as defined in the appended claims.

I claim:

1. A SQUID system comprising:
   a first SQUID including first and second Josephson junctions, a first superconducting line connecting the first and second Josephson junctions and having an inductance component, and a first superconducting magnetically coupled line connected to a sensing element and magnetically coupled to the first superconducting line, said sensing element supplying a current to be measured representing a quantity proportional to a flux quantum, and sending the current through the first superconducting magnetically coupled line; and
   a bias circuit, connected to the first superconducting line at a first injection point therein, for supplying a bias current to the first SQUID through the first injection point,
   said first SQUID having a predetermined threshold characteristic which is asymmetrical with respect to a coordinate defined by the current to be measured and the bias current, and defines whether the Josephson junctions are in a superconducting state or in a voltage output state,
   said bias current supplied from the bias circuit comprising pulses which are alternately positive polarity pulses and negative polarity pulses, and have a first frequency, and
   said threshold characteristic and the bias current being defined to output an output signal from the first injection point and including pulses having a frequency equal to the first frequency, the number of the output pulses being proportional to the current to be measured or depending on the current to be measured and a polarity of the output pulse corresponding to a polarity of the current to be measured.

2. A SQUID system according to claim 1, wherein said bias current has a form of pulses, each pulse including a rising portion having an amplitude and a trailing portion having an amplitude lower than that of the rising portion.

3. A SQUID system according to claim 2, wherein said bias circuit comprises an oscillator generating an oscillation signal having the first frequency, and a Josephson junction pulser operatively connected to the oscillator and operated together with the first SQUID, for outputting the bias pulses having the rising and trailing portions.

4. A SQUID system according to claim 1, wherein said first SQUID further comprises a second superconducting magnetically coupled line magnetically coupled to the first superconducting line, and
   further comprising a feedback circuit, an input thereof being connected to the first injection point and an output thereof being connected to the second junction line, the feedback circuit receiving the output pulses and outputting a feedback signal to the second magnetically coupled line to cancel a magnetic flux on the basis of the current to be measured by another magnetic flux on the basis of the feedback signal.

5. A SQUID system according to claim 4, wherein said feedback circuit comprises a pulse counting circuit counting up and down in response to positive and negative polarity pulses, and a digital to analog converter, operatively connected to the pulse counting circuit, receiving a counted digital value from the pulse counting circuit and converting said counted value into an analog signal supplied to the second magnetically coupled line.

6. A SQUID system according to claim 4, wherein said pulse counting circuit and said digital to analog converter are formed by a superconducting circuit together with the first SQUID.

7. A SQUID system according to claim 5, wherein said feedback circuit further comprises a controller for proportional, integral and/or differential control of a circuit including the feedback circuit.

8. A SQUID system according to claim 7, wherein said controller is formed by a superconducting circuit together with the pulse counting circuit, the digital to analog converter and the first SQUID.

9. A SQUID system according to claim 4, wherein said first SQUID further comprises a third superconducting magnetically coupled line magnetically coupled to the first superconducting line, and further comprising a control circuit for outputting a triangle-wave control signal to the third magnetically coupled line, said triangle-wave control signal having a second frequency lower than the first frequency of the bias current, and said triangle-wave control signal being magnetically superimposed on the current to be measured.

10. A SQUID system according to claim 9, wherein said control circuit comprises an oscillator generating an oscillation signal, a frequency-divider connected to the oscillator and dividing the oscillation signal to a signal having the second frequency, and a low pass filter connected to the frequency-divider.

11. A SQUID system according to claim 10, wherein said frequency-divider and said low pass filter are formed by a superconducting circuit together with the first SQUID.

12. A SQUID system according to claim 11, wherein said oscillator for the control circuit and said oscillator for the bias circuit are commonly used.

13. A SQUID system according to claim 1, wherein said bias circuit supplies an amplitude modulation pulsed bias current, the maximum amplitude of said bias current being higher than a total critical current of the first SQUID, the minimum amplitude of said bias current being lower than the total critical current, said maximum and minimum amplitudes and the threshold characteristic of the first SQUID being defined to output the output signal comprising at least one pulse from an injection point, the number of the output pulses being proportional to the measurement current.

14. A SQUID system according to claim 13, wherein said amplitude modulation pulsed bias current is modulated by a sinusoidal-wave signal.

15. A SQUID system according to claim 14, wherein said bias circuit comprises an oscillator generating an oscillation signal having the first frequency, and an amplitude modulation circuit connected to the oscillator and modulating the oscillation signal by the sinusoidal signal.

16. A SQUID system according to claim 1, further comprising:
a second SQUID including third and fourth Josephson junctions, a second superconducting line connecting said third and fourth Josephson junctions and having a second inductance component, and a fourth superconducting magnetically coupled line magnetically coupled to said second superconducting line; and
a superconducting additional line portion comprising an additional superconducting line, having an inductance component, operatively connected to said second injection point at a terminal thereof and a common connected point of the third and fourth Josephson junctions, and magnetically coupled to said first superconducting line in the first SQUID,
a second injection point in said second superconducting line and a terminal of said fourth superconducting magnetically coupled line operatively connected to the first injection line to generate a positive and a negative flux quantum in response to a positive and a negative polarity of an output pulse from the first injection point, and
said additional superconducting line storing a magnetic flux in response to the positive flux quantum from said second SQUID and outputting a magnetic flux therein in response to the negative flux quantum, adding said magnetic flux therein to said first superconducting line in the first SQUID and supplying a current proportional to the stored magnetic flux to the second injection point.

17. A SQUID system according to claim 16, wherein said second SQUID comprises a first superconducting resistor connected between the input terminal of the fourth superconducting magnetically coupled line and the first injection point, and a second superconducting resistor connected between the first and second injection points,
resistance of the first and second superconducting resistors being defined to generate a flux quantum in the second SQUID in response to an output pulse from the first injection point.

18. A SQUID system according to claim 17, further comprising a superconducting damping resistor connected in parallel to the additional superconducting line.

19. A SQUID system according to claim 18, wherein the second SQUID, the additional superconducting line and the damping resistor are formed by a superconducting circuit together with the first SQUID.

20. A SQUID system according to claim 16, wherein another terminal of said fourth superconducting magnetically coupled line is connected to said second injection point.

21. A SQUID system according to claim 20, further comprising a superconducting damping resistor connected in parallel to the additional superconducting line.

22. A SQUID system according to claim 21, wherein the second SQUID, the additional superconducting line and the damping resistor are formed by a superconducting circuit together with the first SQUID.

23. A SQUID system comprising:
a first SQUID including first and second Josephson junctions, a first superconducting line connecting the first and second Josephson junctions and having an inductance component, and a first superconducting magnetically coupled line connected to a sensing element and magnetically coupled to the first superconducting line, said sensing element supplying a current to be measured representing a quantity proportional to a flux quantum, and sending the current through the first superconducting magnetically coupled line; and a bias circuit, connected to the first superconducting line at a first injection point therein, for supplying a bias current to the first SQUID through the first injection point, said first SQUID having a predetermined threshold characteristic which is asymmetrical with respect to a coordinate defined by the current to be measured and the bias current, and defines whether the Josephson junctions are in a superconducting state or in a voltage output state, said bias circuit supplying a pulsed bias current having the first frequency, and at least one polarity, an amplitude of the pulsed bias current being approximately equal to or slightly lower than a total critical current of the first SQUID, an output signal comprising one or more pulses, the number thereof being proportional to the current to be measured, is output from the first injection point.

24. A SQUID system according to claim 23, further comprising a pulse counting circuit connected to the first injection point and counting pulses output from the first injection point.

25. A SQUID system according to claim 23, wherein said first SQUID further comprises a second superconducting magnetically coupled line magnetically coupled to the first superconducting line, and further comprising a feedback circuit, an input thereof being connected to the first injection point and an output thereof being connected to the second junction line, the feedback circuit receiving the output pulses and outputting a feedback signal to the second magnetically coupled line to cancel a magnetic flux on the basis of the current to be measured by another magnetic flux on the basis of the feedback signal.

26. A SQUID system according to claim 23, wherein said feedback circuit comprises a pulse counting circuit counting up and down in response to positive and negative polarity pulses, and a digital to analog converter, operatively connected to the pulse counting circuit, receiving a counted digital value from the pulse counting circuit and converting said counted value into an analog signal supplied to the second junction line.

27. A SQUID system according to claim 26, wherein said pulse counting circuit and said digital to analog converter are formed by a superconducting circuit together with the first SQUID.

28. A SQUID system according to claim 27, wherein said feedback circuit further comprises a controller for proportional, integral and/or differential controlling a circuit including the feedback circuit.

29. A SQUID system according to claim 28, wherein said controller is formed by a superconducting circuit together with the pulse counting circuit, the digital to analog converter and the first SQUID.

30. A SQUID system according to claim 23, further comprising:

a second SQUID including third and fourth Josephson junctions, a second superconducting line connecting said third and fourth Josephson junctions and having a second inductance component, and a fourth superconducting magnetically coupled line magnetically coupled to said second superconducting line; and a superconducting additional line portion comprising an additional superconducting line, having an inductance component operatively connected to said second injection point at a terminal thereof and a common connected point of the third and fourth Josephson junctions, and magnetically coupled to said first superconducting line in the first SQUID, a second injection point in said second superconducting line and a terminal of said fourth superconducting magnetically coupled line operatively connected to the first injection line to generate a positive and a negative flux quantum in response to a positive and a negative polarity of an output pulse from the first injection point, and said additional superconducting line storing magnetic flux in response to the positive flux quantum from the second SQUID or outputting magnetic flux therein in response to the negative flux quantum, adding said magnetic flux therein to said first superconducting line in the first SQUID and supplying a current proportional to the stored magnetic flux to the second injection point.

31. A SQUID system according to claim 30, wherein said second SQUID comprises a first superconducting resistor connected between the input terminal of the fourth superconducting magnetically coupled line and the first injection point, and a second superconducting resistor connected between the first and second injection points, resistance of the first and second superconducting resistors being defined to generate a flux quantum in the second SQUID in response to an output pulse from the first injection point.

32. A SQUID system according to claim 31, further comprising a superconducting damping resistor connected in parallel to the additional superconducting line.

33. A SQUID system according to claim 32, wherein the second SQUID, the additional superconducting line and the damping resistor are formed by a superconducting circuit together with the first SQUID.

34. A SQUID system according to claim 30, wherein another terminal of said fourth superconducting magnetically coupled line is connected to said second injection point.

35. A SQUID system according to claim 34, wherein further comprising a superconducting damping resistor connected in parallel to the additional superconducting line.

36. A SQUID system according to claim 35, wherein the second SQUID, the additional superconducting line and the damping resistor are formed by a superconducting circuit together with the first SQUID.

* * * * *